US012765094B2

(12) United States Patent
Masuda et al.

(10) Patent No.: US 12,765,094 B2
(45) Date of Patent: Oct. 13, 2026

(54) IMAGING ELEMENT PACKAGE AND ELECTRONIC DEVICE

(71) Applicant: SONY SEMICONDUCTOR SOLUTIONS CORPORATION, Kanagawa (JP)

(72) Inventors: Yoshiaki Masuda, Kanagawa (JP); Takashi Miyanaga, Kanagawa (JP); Koshi Okita, Kanagawa (JP); Shinichiro Noudo, Kanagawa (JP); Shingo Hamaguchi, Kanagawa (JP); Atsushi Toda, Kanagawa (JP); Tomohiko Asatsuma, Kanagawa (JP); Naoki Yamashita, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 370 days.

(21) Appl. No.: 18/566,150

(22) PCT Filed: May 23, 2022

(86) PCT No.: PCT/JP2022/021098

§ 371 (c)(1),
(2) Date: Dec. 1, 2023

(87) PCT Pub. No.: WO2022/259849

PCT Pub. Date: Dec. 15, 2022

(65) Prior Publication Data

US 2024/0363656 A1 Oct. 31, 2024

(30) Foreign Application Priority Data

Jun. 8, 2021 (JP) ................................. 2021-095539

(51) Int. Cl.
*H10F 39/00* (2025.01)
*H04N 25/79* (2023.01)
*H10F 39/18* (2025.01)

(52) U.S. Cl.
CPC .......... *H10F 39/805* (2025.01); *H04N 25/79* (2023.01); *H10F 39/182* (2025.01);
(Continued)

(58) Field of Classification Search
CPC .. H10F 39/805; H10F 39/182; H10F 39/8057; H10F 39/12
See application file for complete search history.

(56) References Cited

U.S. PATENT DOCUMENTS

2010/0025791 A1 2/2010 Ogawa et al.
2014/0217486 A1 8/2014 Akiyama
2017/0077169 A1 3/2017 Masuda et al.
2017/0287962 A1 10/2017 Ootsuka
2018/0204870 A1* 7/2018 Momiuchi ............ H10F 39/811
2021/0005655 A1 1/2021 Kawazoe
(Continued)

FOREIGN PATENT DOCUMENTS

JP 2010-040621 2/2010
JP 2011-165775 8/2011
(Continued)

OTHER PUBLICATIONS

International Search Report and Written Opinion prepared by the Japan Patent Office on Jul. 21, 2022, for International Application No. PCT/JP2022/021098, 3 pgs.

*Primary Examiner* — Douglas M Menz
(74) *Attorney, Agent, or Firm* — SHERIDAN ROSS P.C.

(57) ABSTRACT

The present disclosure relates to an imaging element package and an electronic device that allow images to be captured with better quality. A support portion configured to support a cover glass that protects a light-receiving surface of a semiconductor substrate provided with a photodiode is provided along an outer periphery of the semiconductor substrate, and an antireflection layer is provided between the
(Continued)

support portion and the semiconductor substrate at least in an area where the support portion is provided. The antireflection layer is provided entirely on the light-receiving surface of the semiconductor substrate, and the support portion is stacked on the antireflection layer. The present disclosure can be applied to a CMOS image sensor, for example.

18 Claims, 36 Drawing Sheets

(52) U.S. Cl.
CPC ....... *H10F 39/804* (2025.01); *H10F 39/8057* (2025.01); *H10F 39/8063* (2025.01); *H10F 39/809* (2025.01)

(56) References Cited

U.S. PATENT DOCUMENTS

| | | | |
|---|---|---|---|
| 2021/0167109 | A1 | 6/2021 | Ishino |
| 2021/0343771 | A1 | 11/2021 | Iida et al. |

FOREIGN PATENT DOCUMENTS

| | | |
|---|---|---|
| JP | 2011-254444 | 12/2011 |
| JP | 2013-084763 | 5/2013 |
| JP | 2016-015479 | 1/2016 |
| JP | 2019-160847 | 9/2019 |
| JP | 2021-086979 | 6/2021 |
| WO | WO 2015/133324 | 9/2015 |
| WO | WO 2016/052249 | 4/2016 |
| WO | WO 2020/085116 | 4/2020 |

* cited by examiner

A

B

IMAGING ELEMENT PACKAGE AND ELECTRONIC DEVICE

CROSS REFERENCE TO RELATED APPLICATIONS

This application is a national stage application under 35 U.S.C. 371 and claims the benefit of PCT Application No. PCT/JP2022/021098, having an international filing date of 23 May 2022, which designated the United States, which PCT application claimed the benefit of Japanese Patent Application No. 2021-095539, filed 8 Jun. 2021, the entire disclosures of each of which are incorporated herein by reference.

TECHNICAL FIELD

The present disclosure relates to an imaging element package and an electronic device, and particularly to an imaging element package and an electronic device that allow images to be captured with better image quality.

BACKGROUND ART

In order to capture images with good image quality, techniques to reduce flare generation have been developed in the field of solid-state imaging devices such as CMOS (Complementary Metal Oxide Semiconductor) image sensors.

For example, PTL 1 discloses a solid-state imaging device having a light-shielding film formed on an OPB pixel area outside of the effective pixel area and a part of the peripheral circuit area.

CITATION LIST

Patent Literature

PTL 1: WO 2020/085116

SUMMARY

Technical Problem

As described above, while such techniques have been developed to reduce flare generation, there has been a demand for further reduction in flare generation, so that images with better image quality can be captured.

With the foregoing in view, the present disclosure is directed to enabling images to be captured with better image quality.

Solution to Problem

An imaging element package according to one aspect of the present disclosure includes a semiconductor substrate provided with a photodiode, a support portion provided along an outer periphery of the semiconductor substrate to support a cover glass that protects a light-receiving surface of the semiconductor substrate, and an antireflection layer provided between the support portion and the semiconductor substrate at least in an area where the support portion is provided.

An electronic device according to one aspect of the present disclosure includes an imaging element package that includes a semiconductor substrate provided with a photodiode, a support portion provided along an outer periphery of the semiconductor substrate to support a cover glass that protects a light-receiving surface of the semiconductor substrate, and an antireflection layer provided between the support portion and the semiconductor substrate at least in an area where the support portion is provided.

According to one aspect of the present disclosure, a semiconductor substrate is provided with a photodiode, a support portion that supports a cover glass that protect the light-receiving surface of the semiconductor substrate is provided along an outer periphery of the semiconductor substrate, and an antireflection layer is provided between the support portion and the semiconductor substrate at least in an area where the support portion is provided.

DESCRIPTION OF EMBODIMENTS

Hereinafter, specific embodiments to which the present disclosure is applied will be described in detail with reference to the drawings.

First Exemplary Configuration of Imaging Element Package

Figure 1:
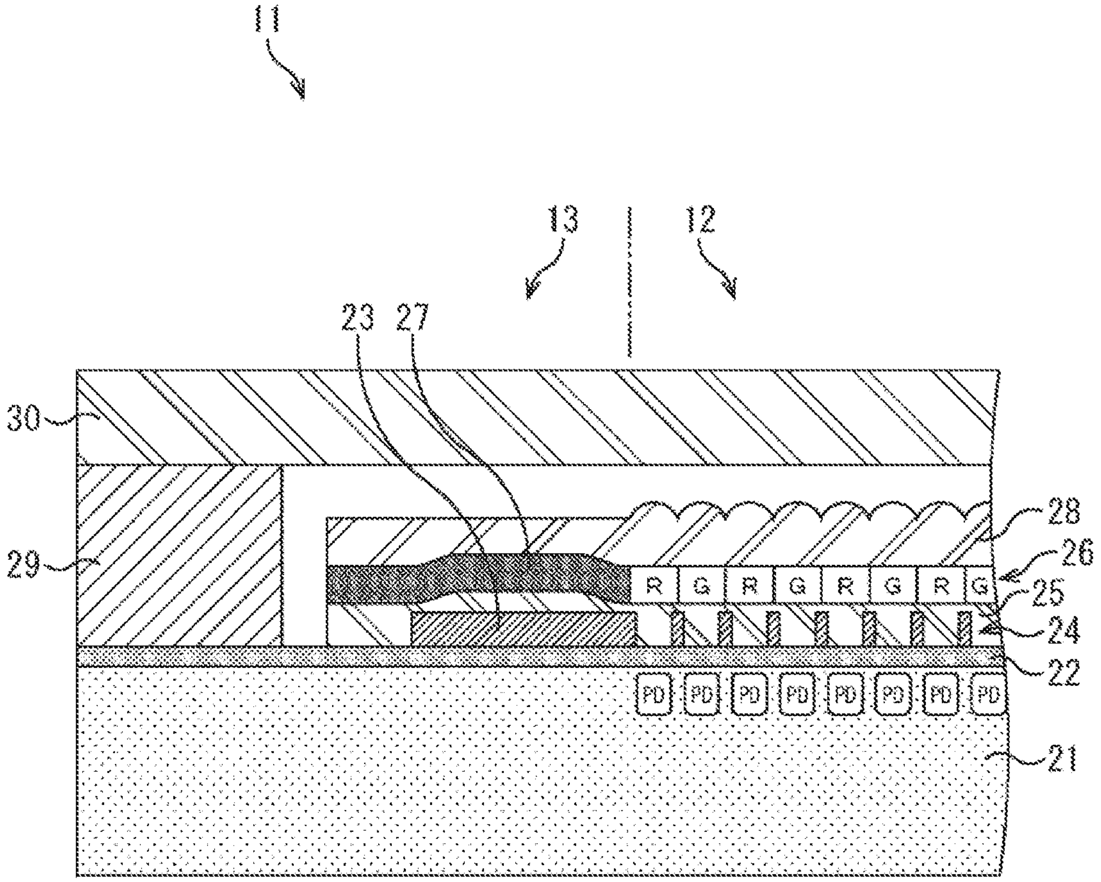
FIG. 1 is a cross-sectional view of an exemplary configuration of an imaging element package according to a first embodiment to which the present disclosure is applied.

FIG. 1 is a cross-sectional view of an exemplary configuration of an imaging element package according to a first embodiment to which the present disclosure is applied.

The imaging element package 11 shown in FIG. 1 has an effective pixel area 12 inside the boundary indicated by the double-dot chain line (on the right side in the figure), and a peripheral area 13 outside of the boundary (on the left side in the figure). In the effective pixel area 12, pixels effectively used for capturing images by the imaging element package 11 are arranged, and the peripheral area 13 is provided in the peripheral part of the imaging element package 11 that is outside of the effective pixel area 12.

The imaging element package 11 includes a semiconductor substrate 21, an antireflection layer 22, a light-shielding layer 23, an inter-pixel light-shielding layer 24, a planarization layer 25, a color filter layer 26, an organic layer 27, an on-chip lens layer 28, a support portion 29, and a cover glass 30.

The semiconductor substrate 21 is for example a silicon substrate on which a photodiode PD is provided for each pixel, and light emitted to the light-receiving surface (the surface facing up in FIG. 1) of the semiconductor substrate 21 is photoelectrically converted at the photodiode PD.

The antireflection layer 22 is provided on the light-receiving surface of the semiconductor substrate 21. The antireflection layer 22 is for example provided on the entire surface of the semiconductor substrate 21. The antireflection layer 22 may include a silicon oxide film formed by film deposition processing. In this way, the antireflection layer 22 prevents reflection of light at the light-receiving surface of the semiconductor substrate 21.

The light-shielding layer 23 and the inter-pixel light-shielding layer 24 are provided by depositing a metal material having a light-shielding property such as tungsten and aluminum. The light-shielding layer 23 is provided in the peripheral area 13, and the inter-pixel light-shielding layer 24 is provided between adjacent pixels in the effective pixel area 12. For example, in the imaging element package 11, the light-shielding layer 23 is provided to have a prescribed width outwardly from the boundary between the effective pixel area 12 and the peripheral area 13.

The planarization layer 25 is provided for example by depositing a TEOS (tetraethoxysilane) film to cover the light-shielding layer 23 and the inter-pixel light-shielding layer 24. The planarization layer 25 is formed to planarize local unevenness as in the inter-pixel light-shielding layer 24 and has a certain thickness in a part with a certain area like the light-shielding layer 23.

The color filter layer 26 includes a filter of a resin including an organic pigment of a color that transmits light received by the pixel (e.g., a filter R that transmits red light, a filter G that transmits green light, or a filter B that transmits blue light) arranged for each of a plurality of pixels.

The organic layer 27 is provided in the same layer as the color filter layer 26 and includes a resin that includes an organic pigment of a desired color (e.g., a color blue that is the same as that of the filter B). For example, the organic layer 27 is formed to cover the light-shielding layer 23. This allows the organic layer 27 to absorb light, so that the light that reaches the light-shielding layer 23 can be attenuated.

The on-chip lens layer 28 includes microlenses arranged to collect light for each pixel.

The support portion 29 is a structure made of a resin material provided along the outer periphery of the semiconductor substrate 21 to support the cover glass 30.

The cover glass 30 protects the light-receiving surface of the semiconductor substrate 21.

The imaging element package 11 has the above-described configuration in which the support portion 29 is stacked on the antireflection layer 22 provided on the light-receiving surface of the semiconductor substrate 21. Therefore, in the imaging element package 11, light transmitted through the support portion 29 in the peripheral area 13 enters and disappears inside the semiconductor substrate 21 through the antireflection layer 22. In the imaging element package 11, light transmitted through the support portion 29 is not reflected at the surface of the semiconductor substrate 21, in other words, reflection is prevented by the antireflection layer 22, so that flare generation attributable to such reflection can be reduced.

The imaging element package 11 having the configuration can capture images with better quality by a structure that reduces flare generation by reducing the amount of light reflected at least in the area where the support portion 29 is provided.

Furthermore, the imaging element package 11 has no metal layer that reflects light between the semiconductor substrate 21 and the support portion 29, which can also further reduce flare generation.

Referring to the plan view of the imaging element package 11 in FIG. 2, the outer peripheral shape of the light-shielding layer 23 will be described.

Figure 2:
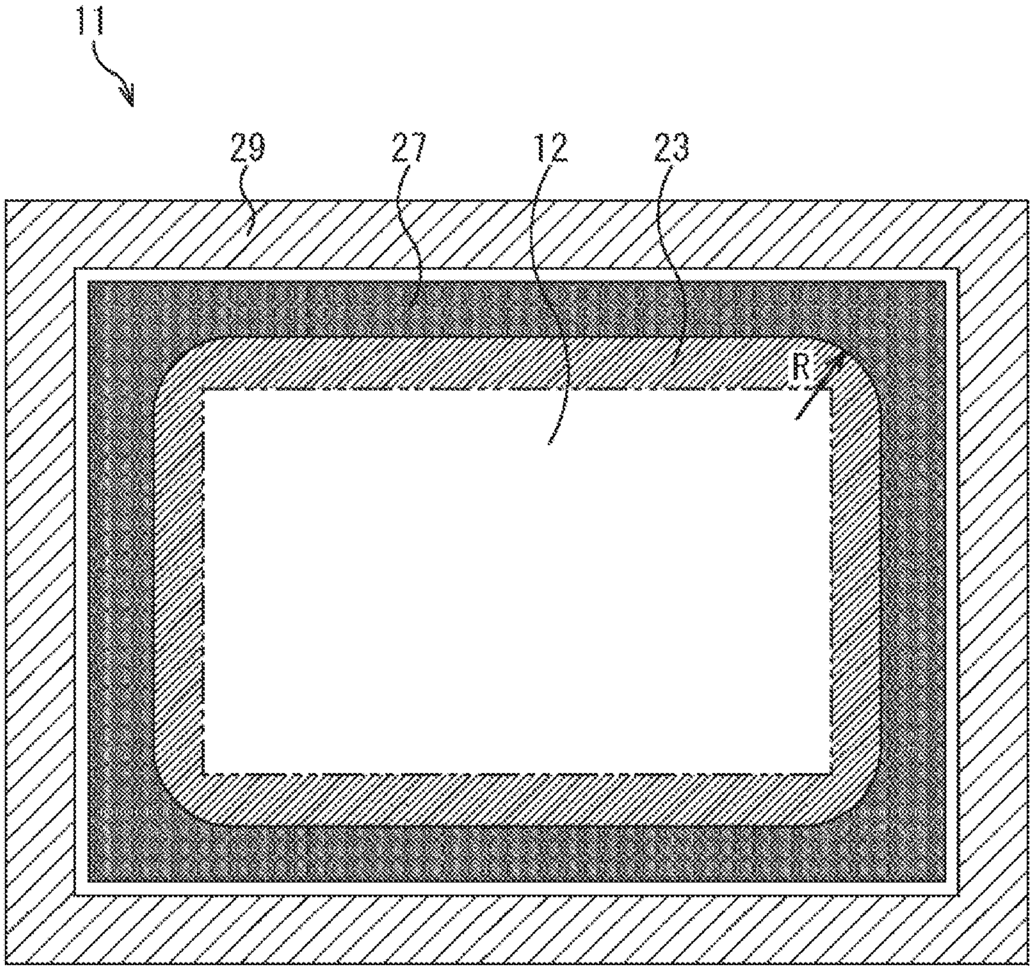
FIG. 2 is a plan view of the imaging element package in FIG. 1.

As shown in FIG. 2, the light-shielding layer 23 has such an outer peripheral shape that the four corners are rounded into an arc shape with a prescribed radius of curvature R. The radius of curvature R at the corners of the light-shielding layer 23 is preferably at least 500 μm and needs only be at least 40 μm.

For example, in the process of manufacturing the imaging element package 11, when the color filter layer 26 is formed by coating, sweeping unevenness occurs due to the effect of steps at the edge of the light-shielding layer 23. If the width of the light-shielding layer 23 is small, sweeping unevenness may affect the effective pixel area 12, resulting in unevenness on the surface of the color filter layer 26. Therefore, in the imaging element package 11, the four corners of the light-shielding layer 23 are rounded, so that the effect of such sweeping unevenness on the effective pixel area 12 can be avoided and the color filter layer 26 may be formed flat.

Figure 3:
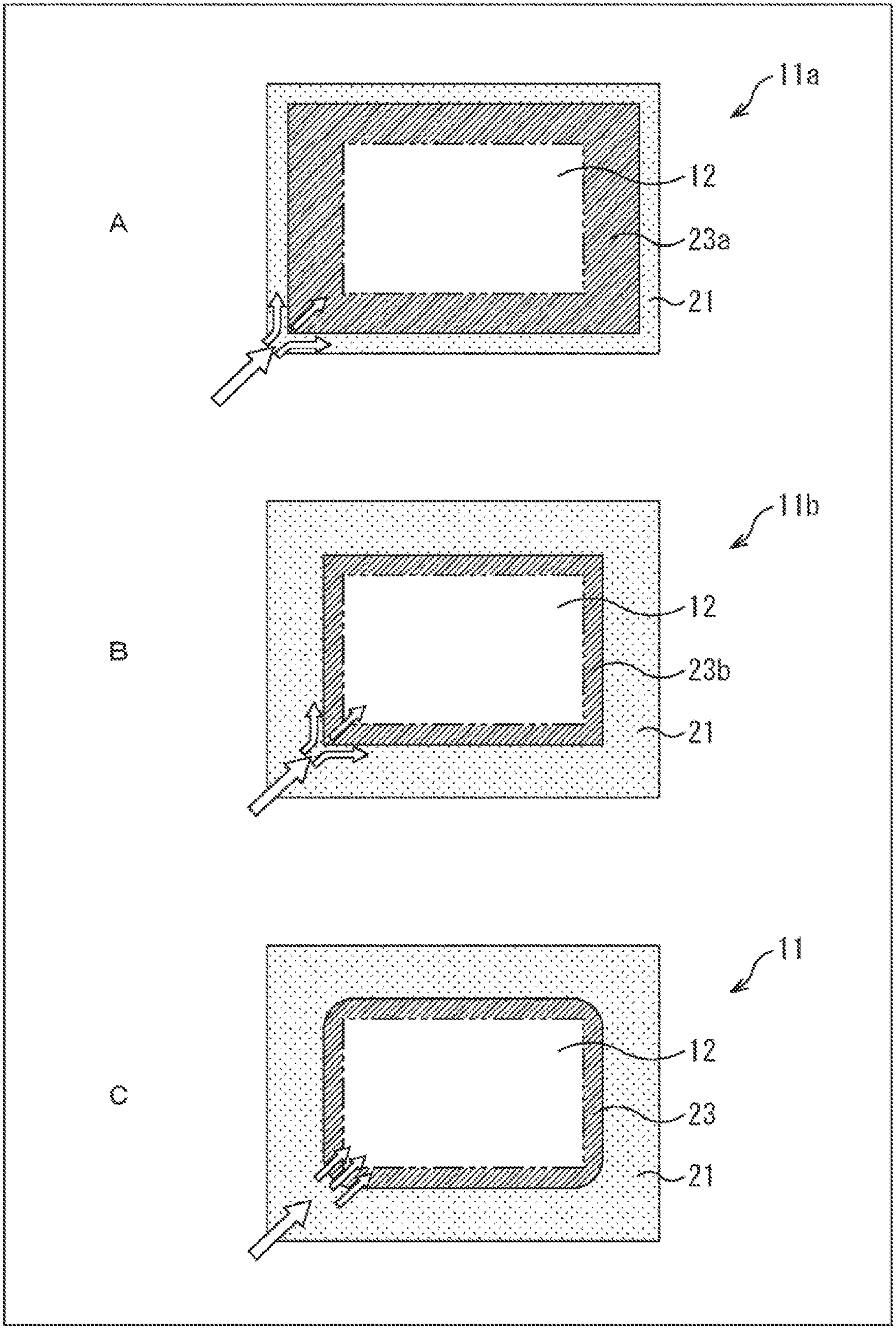
FIG. 3 is a view for illustrating sweeping unevenness when a color filter layer is formed.

Referring to FIG. 3, sweeping unevenness in forming the color filter layer 26 will be described.

For example, an imaging element package 11*a* shown in FIG. 3 at A has a light-shielding layer 23*a* that is wider than the light-shielding layer 23 of the imaging element package 11, and the light-shielding layer 23*a* has such a peripheral shape that the four corners are right angled. In the imaging element package 11*a* having the above-described configuration, when the material is applied as indicated by the outline arrows to form the color filter layer 26, the flow of the material changes to diverge at steps at the corner of the light-shielding layer 23*a*, which causes sweeping unevenness. In this case, in the imaging element package 11*a*, since the light-shielding layer 23*a* is wide, the adverse effect of the sweeping unevenness on the effective pixel area 12 can be prevented.

An imaging element package 11*b* shown in FIG. 3 at B includes a light-shielding layer 23*b* having a width equivalent to the light-shielding layer 23 of the imaging element package 11, and the light-shielding layer 23*b* has an outer peripheral shape having four corners which are right-angled. In the imaging element package 11*b* having the above configuration, when the material is applied to form the color filter layer 26 as indicated by the outline arrows, the flow of the material changes to diverge at steps in the corners of the light-shielding layer 23*b*, which causes sweeping unevenness. In the imaging element package 11*b*, since the width of the light-shielding layer 23*a* is small, the effective pixel area 12 can be affected by the sweeping unevenness.

In contrast, as shown in FIG. 3 at C, in the imaging element package 11, the light-shielding layer 23 is formed to have a peripheral shape having four corners rounded. In the imaging element package 11 having the configuration, when a material is applied as indicated by the outline arrows to form the color filter layer 26, the rounded corners of the light-shielding layer 23 reduce the divergence of the material flow at the steps at the corners of the light-shielding layer 23, which reduces sweeping unevenness. Therefore, in the imaging element package 11, even when the width of the light-shielding layer 23 is small, the adverse effect of the sweeping unevenness on the effective pixel area 12 can be prevented.

Figure 4:
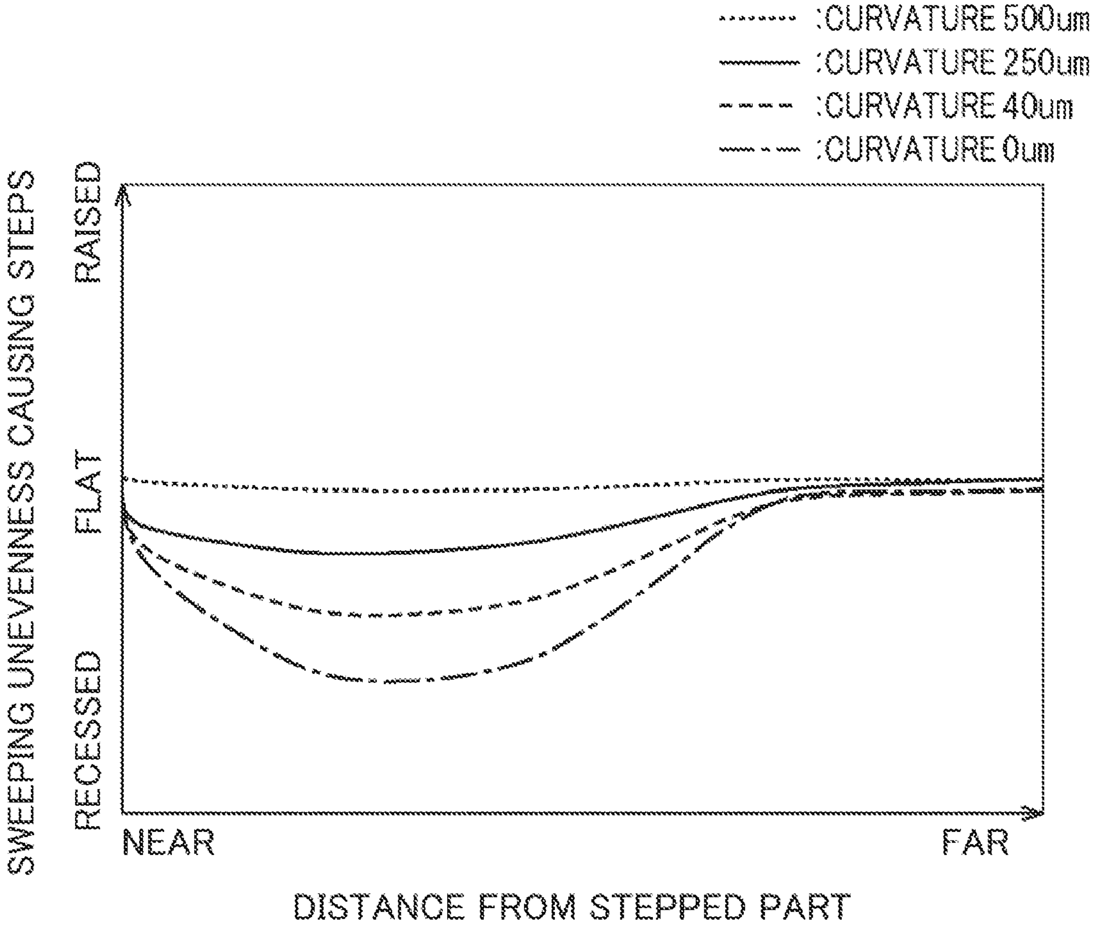
FIG. 4 illustrates the effect of radius of curvature of a light-shielding layer.

FIG. 4 illustrates the effect of reducing sweeping unevenness according to the radius of curvature R in the light-shielding layer 23. In FIG. 4, the ordinate indicates the size of an uneven part on the surface of the color filter layer 26 generated by the effect of sweeping unevenness due to the steps at the ends of the light-shielding layer 23, and the abscissa indicates the distance of the light-shielding layer 23 from the steps at the ends.

For example, as illustrated, when the radius of curvature R is 0 (i.e., when the corners are right-angled), the depth of recess is the greatest due to the effect of sweeping unevenness. Also as illustrated, when the radius of curvature R is 40 μm, the depth of recess attributable to the effect of sweeping unevenness becomes smaller, and when the radius of curvature R is 250 μm, the depth is even smaller. Furthermore, as illustrated, when the radius of curvature R is 500 μm, the effect of reducing the depth of the recess due to the sweeping unevenness saturates.

In this way, as the radius of curvature R for rounding the corners of the light-shielding layer 23 increases, the depth of recess attributable to the effect of sweeping unevenness is reduced, and when the radius of curvature R is 500 μm or more, the surface of the color filter layer 26 in the effective pixel area 12 can be formed flat. This allows the imaging element package 11 to capture images with better image quality without the degradation of image quality that would result when the surface of the color filter layer 26 is uneven due to the effect of sweeping unevenness.

In the imaging element package 11 of each exemplary configuration (each variation) that will be described in the following, the light-shielding layer 23 is also formed in an external shape having the four corners rounded into an arc shape with a prescribed radius of curvature R.

Figure 5:
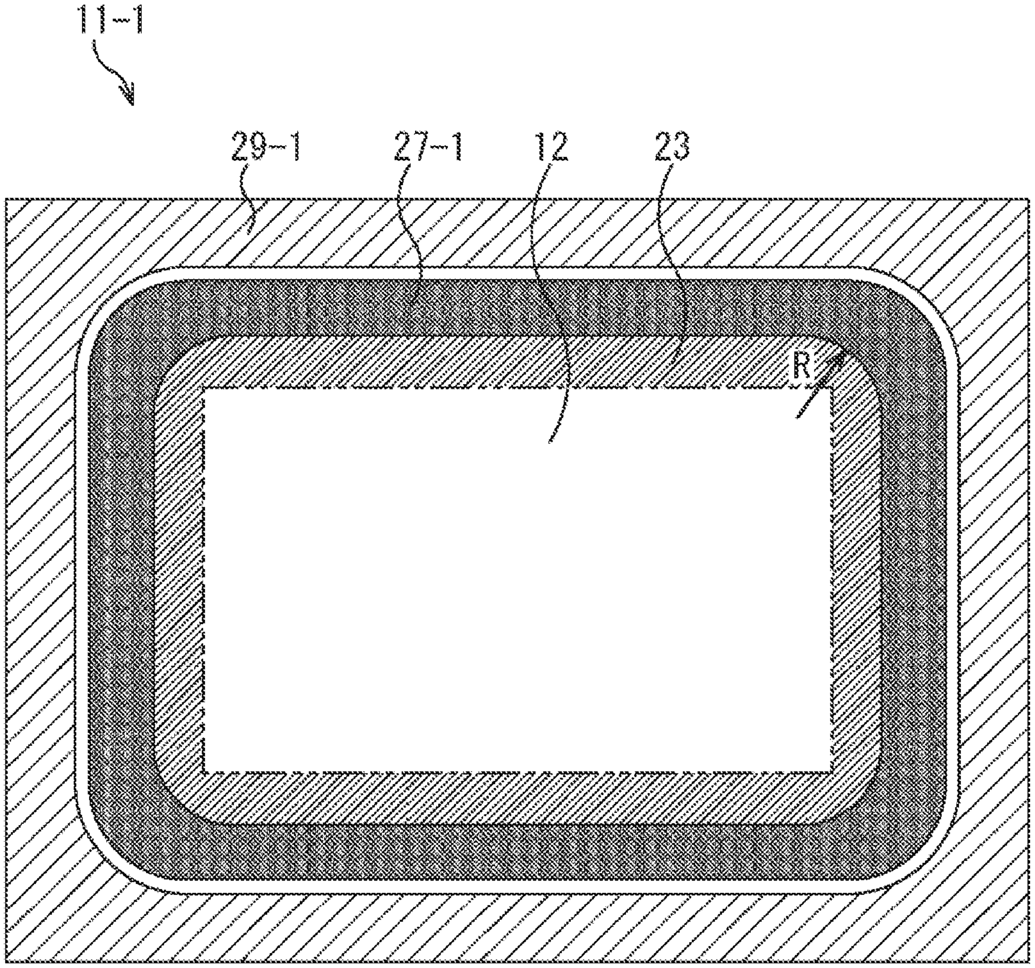
FIG. 5 is a plan view of an exemplary configuration of a first variation of the first embodiment.

FIG. 5 is a plan view of an exemplary configuration of a first variation of the imaging element package 11. In the imaging element package 11-1 shown in FIG. 5, the same elements as those of the imaging element package 11 in FIG. 2 are designated by the same reference characters, and their detailed descriptions will not be provided.

As shown in FIG. 5, the imaging element package 11-1 is the same as the imaging element package 11 in FIG. 2 in that each corner of the light-shielding layer 23 provided outside the effective pixel area 12 is formed with a prescribed curvature radius R.

In the imaging element package 11-1, similarly to the light-shielding layer 23, an organic layer 27-1 is formed to have such a peripheral shape that the four corners are rounded. Furthermore, in the imaging element package 11-1, a support portion 29-1 is formed to have an inner peripheral shape having four corners rounded to conform to the outer peripheral shape of the organic layer 27-1.

Similarly to the imaging element package 11 in FIG. 1, the imaging element package 11-1 having the above configuration can prevent sweeping unevenness from affecting the effective pixel area 12 and can capture images with better image quality. Furthermore, in the imaging element package 11-1, the junction area between the support portion 29-1 and the antireflection layer 22 can be expanded for the area vacated by rounding the corners of the inner peripheral shape of the support portion 29-1, and the bonding strength of the support portion 29-1 to the antireflection layer 22 can be improved. In this way, in the imaging element package 11-1, the support portion 29-1 can be prevented from coming off, which can further improve reliability.

Figure 6:
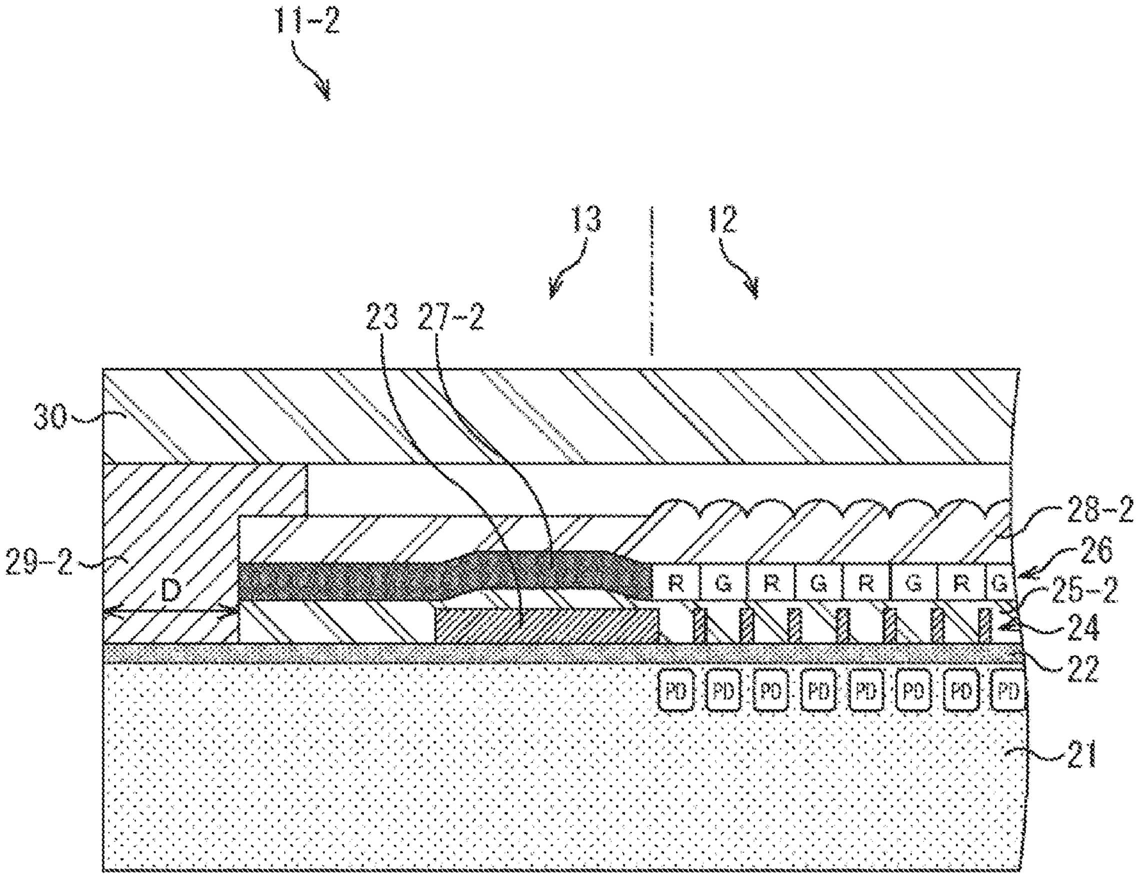
FIG. 6 is a cross-sectional view of an exemplary configuration of a second variation of the first embodiment.

FIG. 6 is a cross-sectional view of an exemplary configuration of a second variation of the imaging element package 11. In the imaging element package 11-2 shown in FIG. 6, the same elements as those of the imaging element package 11 in FIG. 1 are designated by the same reference characters, and their detailed descriptions will not be provided.

As shown in FIG. 6, the imaging element package 11-2 has the same configuration as the imaging element package 11 in FIG. 1 in that the support portion 29-2 is stacked on the antireflection layer 22 provided on the light-receiving surface of the semiconductor substrate 21. In other words, similarly to the imaging element package 11 in FIG. 1, the imaging element package 11-2 can capture images with good image quality by a structure that reduces flare generation.

The configuration of the imaging element package 11-2 is different from that of the imaging element package 11 in FIG. 1 in that a part of the support portion 29-2 overlaps a part of each of a planarization layer 25-2, an organic layer 27-2, and an on-chip lens layer 28-2. For example, the support portion 29-2 needs only be bonded with the antireflection layer 22 for such a width D that the support portion 29-2 and the antireflection layer 22 have sufficient bonding strength. Specifically, a sufficient bonding strength can be obtained for a width D of at least 150 μm.

Note that the width for which a part of the support portion 29-2 and a part of each of the planarization layer 25-2, the organic layer 27-2, and the on-chip lens layer 28-2 overlap is preferably not more than a half of the width of the entire support portion 29-2 (the width of that part of the support portion 29-2 bonded with the cover glass 30).

The imaging element package 11-2 having the above configuration can attenuate light that reaches the semiconductor substrate 21 as the light is absorbed by the organic layer 27-2 in the part of the support portion 29-2 that overlaps the organic layer 27-2. In the part where the support portion 29-2 is bonded to the antireflection layer 22, light transmitted through the support portion 29 enters into the semiconductor substrate 21 through the antireflection layer 22 and disappears, similarly to the imaging element package 11 in FIG. 1.

Therefore, the imaging element package 11-2 can prevent reflection of light at least in the area where the support portion 29-2 is provided and can capture images with better quality by a structure that reduces flare generation.

Figure 7:
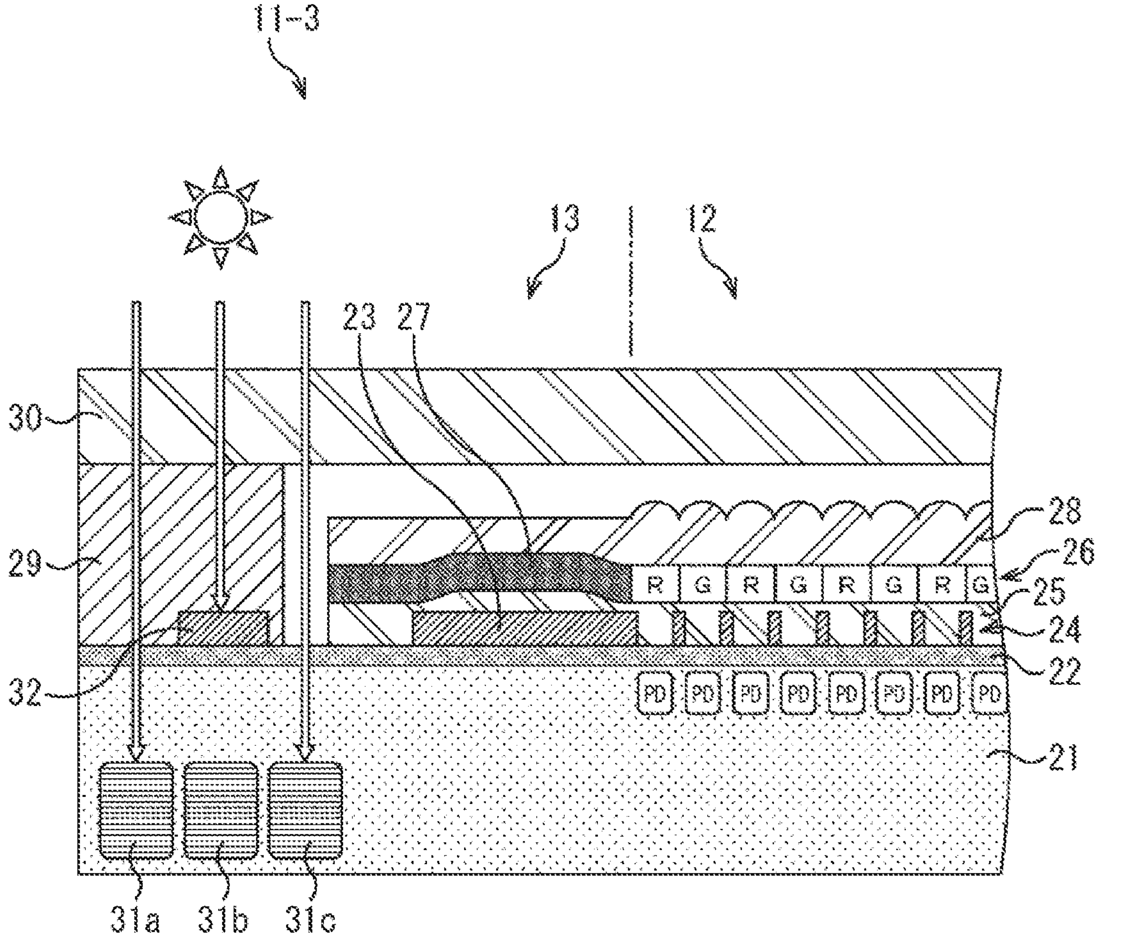
FIG. 7 is a cross-sectional view of an exemplary configuration of a third variation of the first embodiment.

FIG. 7 is a cross-sectional view of an exemplary configuration of a third variation of the imaging element package 11. In the imaging element package 11-3 shown in FIG. 7, the same elements as those of the imaging element package 11 in FIG. 1 are designated by the same reference characters, and their detailed descriptions will not be provided.

As shown in FIG. 7, the imaging element package 11-3 is formed similarly to the imaging element package 11 in FIG. 1 in that the support portion 29 is stacked on the antireflection layer 22 provided on the light-receiving surface of the semiconductor substrate 21. In other words, similarly to the imaging element package 11 in FIG. 1, the imaging element package 11-3, can capture images with good image quality by a structure that reduces flare generation.

The imaging element package 11-3 is different from the imaging element package 11 in FIG. 1 in that peripheral circuits 31*a* to 31*c* are provided inside the semiconductor substrate 21 and a light-shielding layer 32 is stacked on the antireflection layer 22.

The peripheral circuits 31*a* to 31*c* are arranged in the peripheral area 13 of the semiconductor substrate 21-3. Among the peripheral circuits 31*a* to 31*c*, the peripheral circuit 31*b* includes a circuit vulnerable to light. The circuit vulnerable to light may include for example a capacitor whose potential difference fluctuates due to the photoelectric effect.

When viewed in a plan view of the imaging element package 11-3, the light-shielding layer 32 is positioned between the peripheral circuit 31*b* vulnerable to light and the support portion 29 to superimpose the peripheral circuit 31*b* with a minimum area for shielding the peripheral circuit 31*b* and shield light toward the peripheral circuit 31*b* as indicated by the outline arrow in FIG. 7.

The imaging element package 11-3 having the configuration can reduce the effect of light that causes the peripheral circuit 31*b* to malfunction by shielding the peripheral circuit 31*b* which is vulnerable to light by the light-shielding layer 32. The imaging element package 11-3 has the light-shielding layer 32 with a minimum area to shield the peripheral circuits 31*b* at least in the area where the support portion 29 is provided, so that reflection of light other than at the light-shielding layer 32 can be prevented to reduce flare generation, so that images with better quality can be captured.

Figure 8:
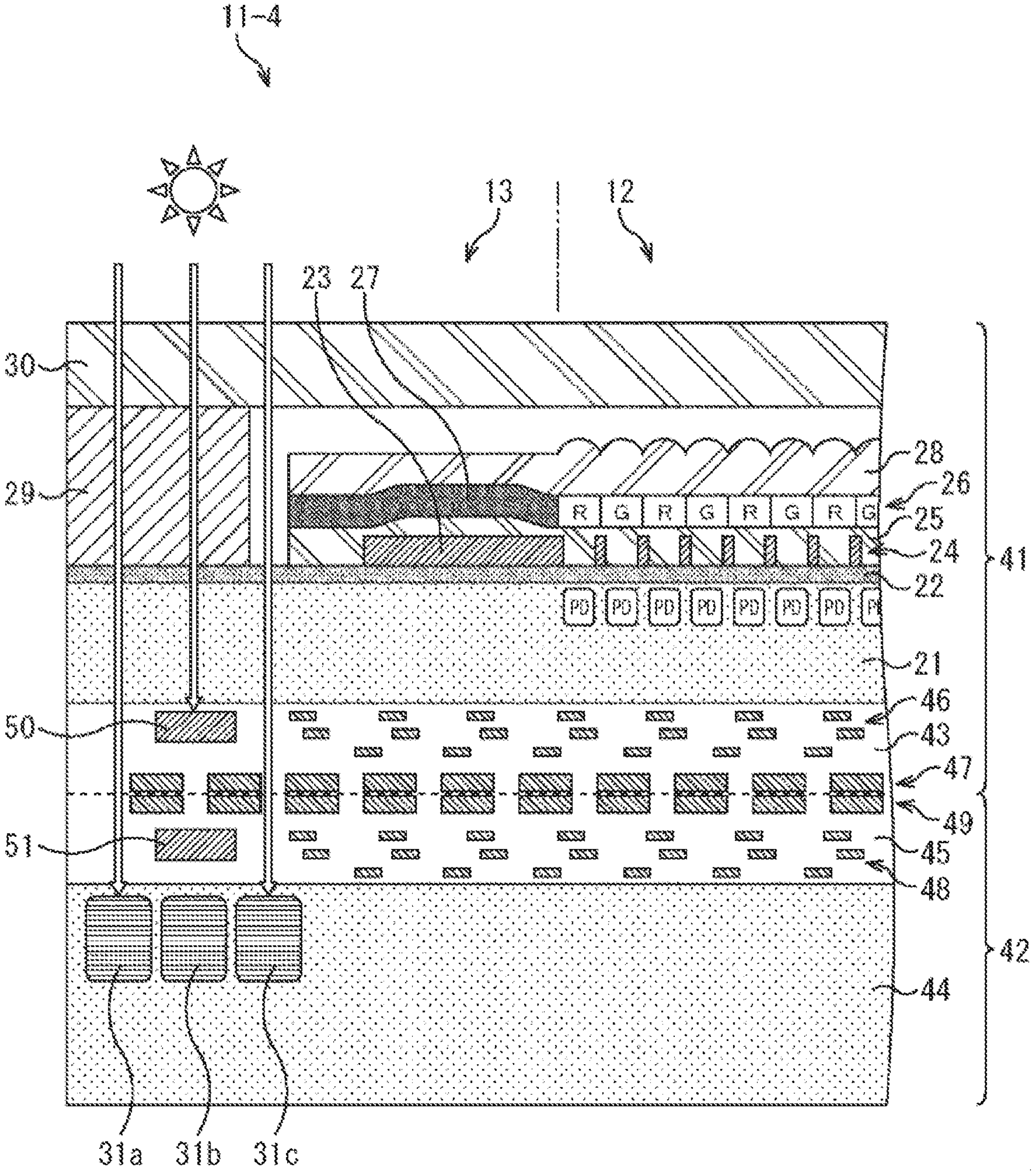
FIG. 8 is a cross-sectional view of an exemplary configuration of a fourth variation of the first embodiment.

FIG. 8 is a cross-sectional view of an exemplary configuration of a fourth variation of the imaging element package 11. In the imaging element package 11-4 shown in FIG. 8, the same elements as those of the imaging element package 11 in FIG. 1 are designated by the same reference characters, and their detailed descriptions will not be provided.

As shown in FIG. 8, the imaging element package 11-4 has the same configuration as the imaging element package 11 in FIG. 1 in that the support portion 29 is stacked on the antireflection layer 22 provided on the light-receiving surface of the semiconductor substrate 21. In other words, similarly to the imaging element package 11 in FIG. 1, the imaging element package 11-4 can capture images with good quality by a structure that reduces flare generation.

Here, the imaging element package 11-4 has a layered structure including a sensor substrate 41 and a logic substrate 42 stacked on each other, and the sensor substrate 41 and the logic substrate 42 are bonded at the bonding surface indicated by the dashed line. The sensor substrate 41 has the same configuration as the imaging element package 11 in FIG. 1, and a multilayer wiring layer 43 is provided on the surface of the semiconductor substrate 21 (on the opposite side to the light-receiving surface). Inside the multilayer wiring layer 43, multiple layers of wiring 46 are provided, and multiple bonding pads 47 are provided on the bonding surface of the multilayer wiring layer 43.

The logic substrate 42 is provided with a logic circuit that executes various kinds of processing in imaging carried out by the imaging element package 11-4 and includes a multilayer wiring layer 45 on the surface of the semiconductor substrate 44. Multiple layers of wiring 48 are provided inside the multilayer wiring layer 45, and a plurality of bonding pads 49 are provided on the bonding surface of the multilayer wiring layer 45. The sensor substrate 41 and the logic substrate 42 are stacked on each other by electrically and mechanically bonding the bonding pads 47 and 49.

In the imaging element package 11-4, peripheral circuits 31*a* to 31*c* are provided inside the semiconductor substrate 44, a dummy wire 50 is provided in the multilayer wiring layer 43, and a dummy wire 51 is provided in the multilayer wiring layer 45. As described above with reference to FIG. 7, the peripheral circuit 31*b* includes a circuit which is vulnerable to light.

When the imaging element package 11-4 is viewed in a plan view, the dummy wires 50 and 51 are positioned between the peripheral circuit 31*b* and the support portion 29 in positions where the dummy wires are superimposed on the peripheral circuit 31*b* with a minimum area for shielding the peripheral circuit 31*b* which is vulnerable to light, and the dummy wires shield light toward the peripheral circuit 31*b* as indicated by the outline arrows in FIG. 8. For example, the dummy wire 50 includes the same metal material as the wiring 46. Also, for example, the dummy wire 51 includes the same metallic material as the wiring 48. Neither of the dummy wires 50 and 51 is connected in such a way to be used as wiring. In other words, the dummy wires 50 and 51 are not used for signal transmission. The dummy wire 50 is electrically isolated from the wiring 46, and the dummy wire 51 is electrically isolated from the wiring 48.

The imaging element package 11-4 having the configuration can reduce the effect of light that may cause the peripheral circuit 31*b* which is vulnerable to light to malfunction by shielding the peripheral circuit 31*b* with the dummy wires 50 and 51. The dummy wires 50 and 51 are arranged to be superimposed on at least a part of the peripheral circuit 31*b* in a plan view. The imaging element package 11-4 is provided with the dummy wires 50 and 51 in a minimum area to shield the peripheral circuit 31*b* at least in an area where the support portion 29 is provided. This reduces flare generation and allows images with better quality to be captured.

Note that instead of providing both the dummy wires 50 and 51, only one of the dummy wires 50 and 51 may be provided. When both the dummy wires 50 and 51 are provided, one of the dummy wires 50 and 51 may be superimposed on a part of the peripheral circuit 31*b* that is not superimposed by the other in a plan view.

Figure 9:
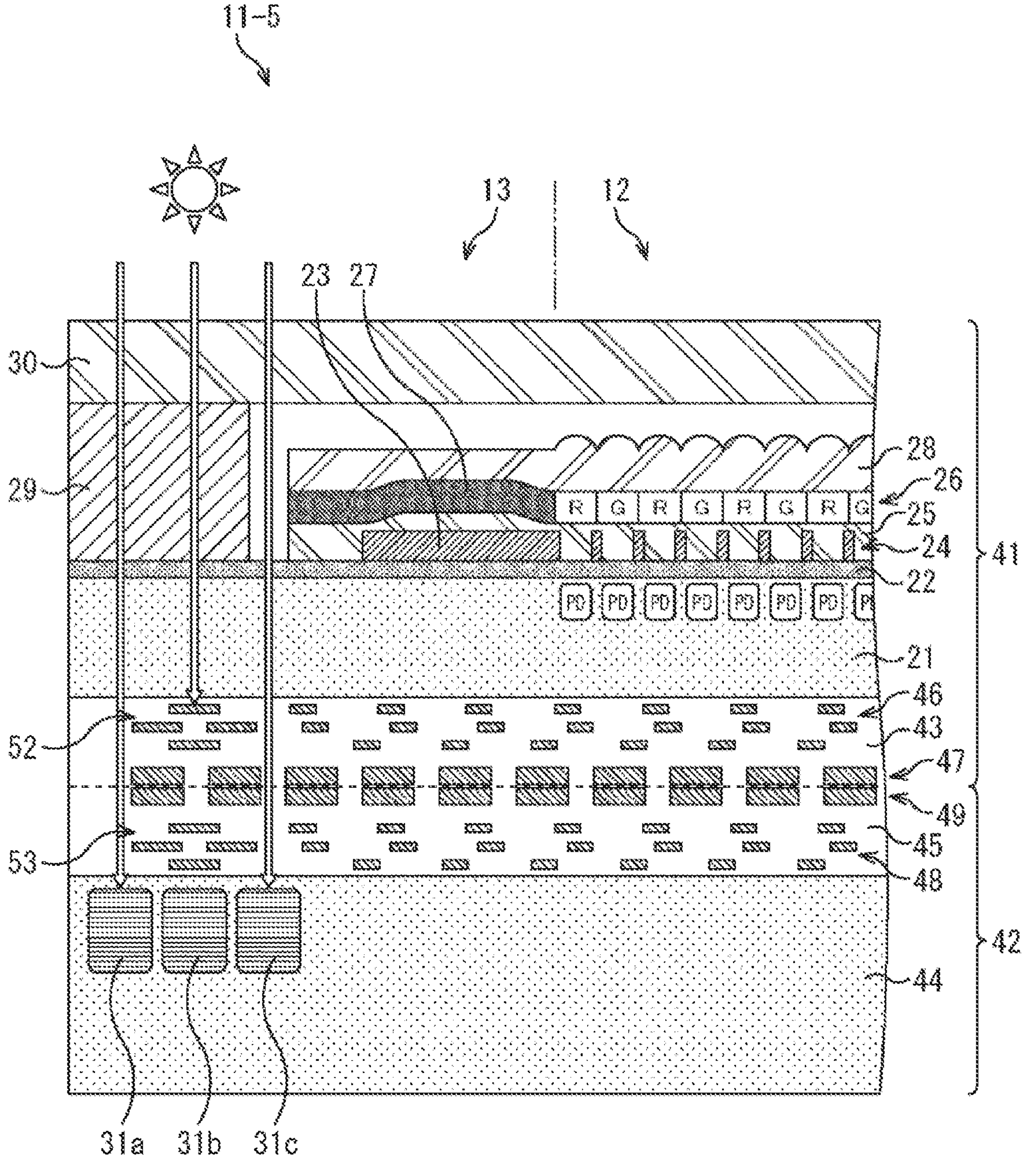
FIG. 9 is a cross-sectional view of an exemplary configuration of a fifth variation of the first embodiment.

FIG. 9 is a cross-sectional view of an exemplary configuration of a fifth variation of the imaging element package 11. In the imaging element package 11-5 shown in FIG. 9, the same elements as those of the imaging element package 11-4 shown in FIG. 8 are designated by the same reference characters, and their detailed descriptions will not be provided.

As shown in FIG. 9, the imaging element package 11-5 has the same configuration as the imaging element package 11-4 shown in FIG. 8 in that the imaging element package has a layered structure including the sensor substrate 41 and the logic substrate 42 stacked on each other, and the support portion 29 is stacked on the antireflection layer 22 provided on the light-receiving surface of the semiconductor substrate 21.

The imaging element package 11-5 includes dummy wires 52 and 53, which are different from the dummy wires 50 and 51 of the imaging element package 11-4 in FIG. 8. For example, the dummy wires 50 and 51 of the imaging element package 11-4 in FIG. 8 are made of a single piece of metal wiring, while the dummy wires 52 and 53 of the imaging element package 11-5 are made of multiple layers of metal wiring.

As illustrated, the dummy wires 52 and 53 are formed so that some of the multiple metal wire layers overlap each other when the imaging element package 11-5 is viewed in a plan view. For example, the dummy wire 52 includes the same metal material in the same layer as the multiple layers of wiring 46, and the dummy wire 53 includes the same metal material in the same layer as the multiple layers of wiring 48. Neither of the dummy wires 52 and 53 is connected in such a way to be used as wiring. In other words, the dummy wires 52 and 53 are not used for signal transmission. The dummy wire 52 is electrically isolated from the wiring 46, and the dummy wire 53 is electrically isolated from the wiring 48.

The dummy wires 52 and 53 are positioned between the peripheral circuit 31*b* and the support portion 29 in positions where the dummy wires 52 and 53 are superimposed on the peripheral circuit 31*b* with a minimum area to shield the peripheral circuit 31*b* when the imaging element package 11-5 is viewed in a plan view, and the dummy wires shield light toward the peripheral circuit 31*b* as indicated by the outline arrow in FIG. 9.

The imaging element package 11-5 having the configuration can reduce the effect of light that may cause the peripheral circuit 31*b* which is vulnerable to light to malfunction by shielding the peripheral circuit 31*b* with the dummy wires 52 and 53. In the imaging element package 11-5, at least in the area where the support portion 29 is provided, the dummy wires 52 and 53 are provided in a minimum area to shield the peripheral circuit 31*b*, so that reflection of light can be prevented other than at the dummy wires 52 and 53, which can reduce flare generation and allows images with better quality to be captured.

Note that instead of providing both the dummy wires 52 and 53, only one of the wires may be provided.

Figure 10:
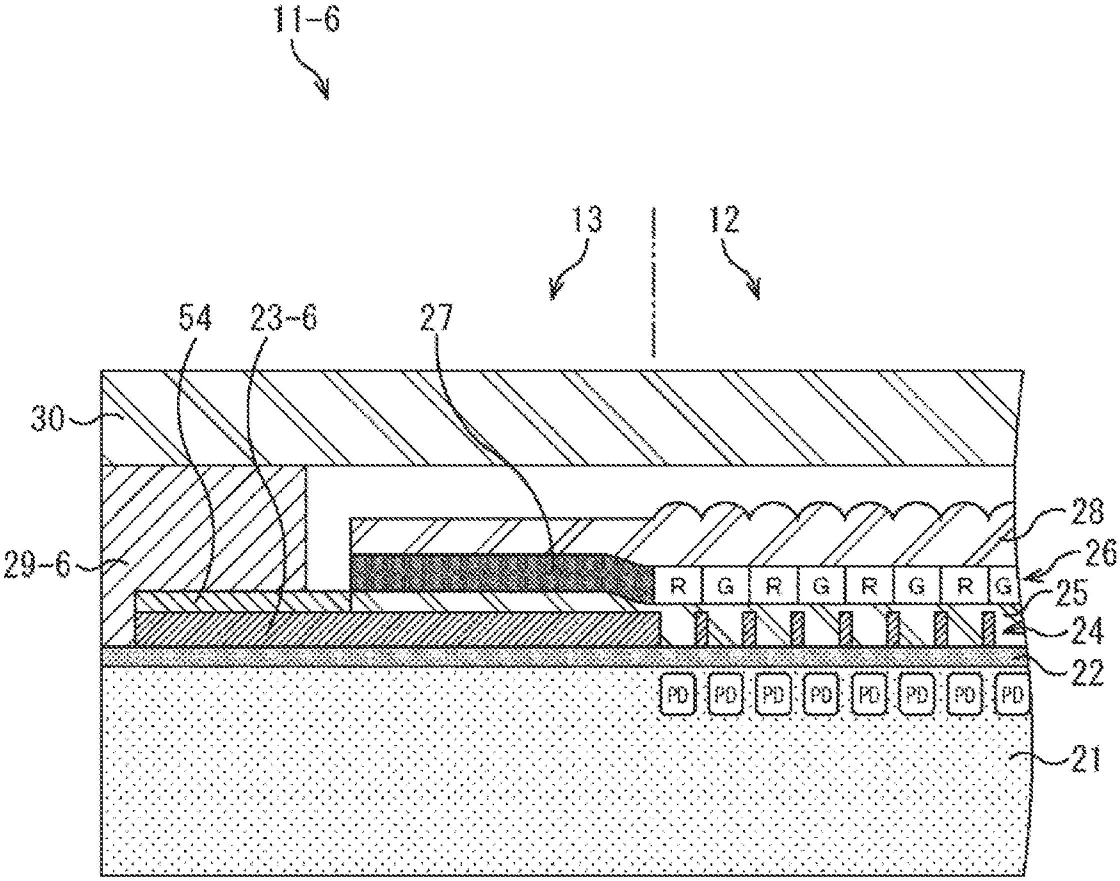
FIG. 10 is a cross-sectional view of an exemplary configuration of a sixth variation of the first embodiment.

FIG. 10 is a cross-sectional view of an exemplary configuration of a sixth variation of the imaging element package 11. In the imaging element package 11-6 shown in FIG. 10, the same elements as those of the imaging element package 11 shown in FIG. 1 are designated by the same reference characters, and their detailed descriptions will not be provided.

As shown in FIG. 10, the imaging element package 11-6 has the same configuration as the imaging element package 11 in FIG. 1 in that a support portion 29-6 is stacked and formed against the antireflection layer 22 provided on the light-receiving surface of the semiconductor substrate 21. This enables the imaging element package 11-6 to capture images with good image quality.

The imaging element package 11-6 has a different configuration from the imaging element package 11 shown in FIG. 1 in that a light-shielding layer 23-6 is provided to extend as far as below the support portion 29-6, and an antireflection layer 54 is provided on the part of the light-shielding layer 23-6 that is not covered with the organic layer 27. More specifically, the imaging element package 11-6 is configured so that the entire surface of the light-shielding layer 23-6 is covered with the organic layer 27 and the antireflection layer 54.

For example, a silicon-based thin film such as a silicon oxynitride film (SiON film) is used for the antireflection layer 54.

Figure 11:
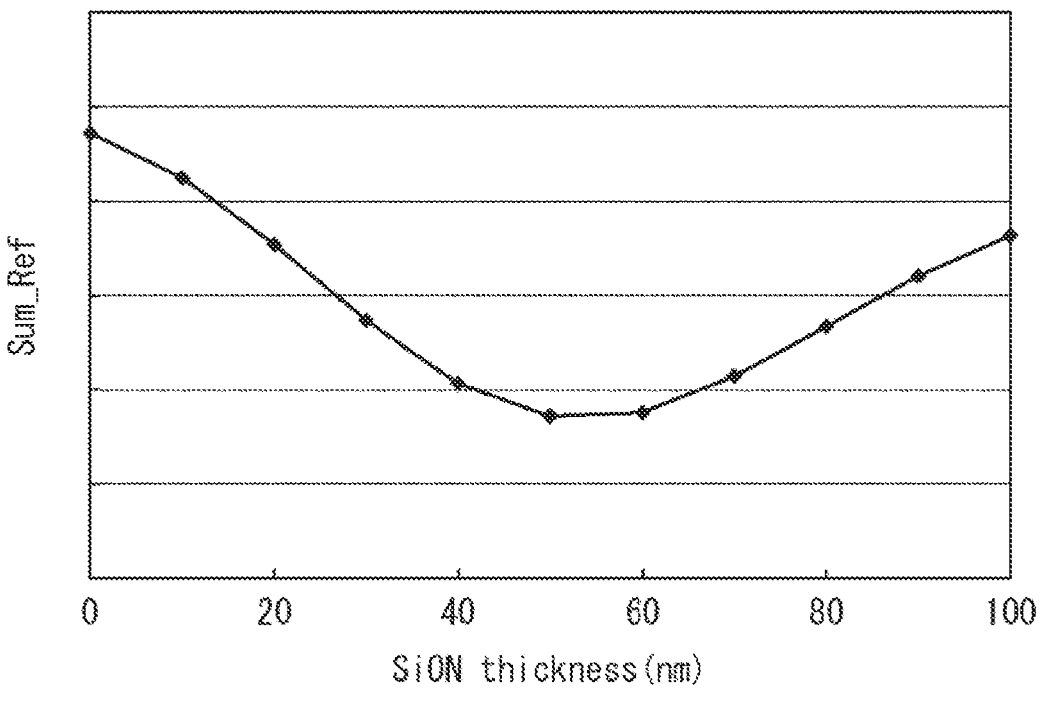
FIG. 11 illustrates the antireflection property of an antireflection layer.

FIG. 11 illustrates an antireflection property of the antireflection layer 54. The abscissa in FIG. 11 represents the thickness of the SiON thin film, and the ordinate in FIG. 11 represents the integral index (Sum_Ref) of reflected light at an angle of 0° to 45° and with a wavelength from 400 nm to 700 nm. As illustrated, the sensitivity of the antireflection layer 54 to reflected light is minimum for a film thickness from 50 nm to 60 nm, and flare generation can be reduced well by forming the antireflection layer 54 having a thickness in the range.

The imaging element package 11-6 having the configuration can prevent reflection of light at least in the area where the support portion 29-6 is provided, which reduces flare generation, so that images with better image quality can be captured.

The antireflection layer 54 may be provided at least in the part not covered with the organic layer 27, and for example, the antireflection layer 54 may be provided in the part of the light-shielding layer 23-6 that is not covered with the organic layer 27 as well as on the entire surface of the light-shielding layer 23-6.

Figure 12:
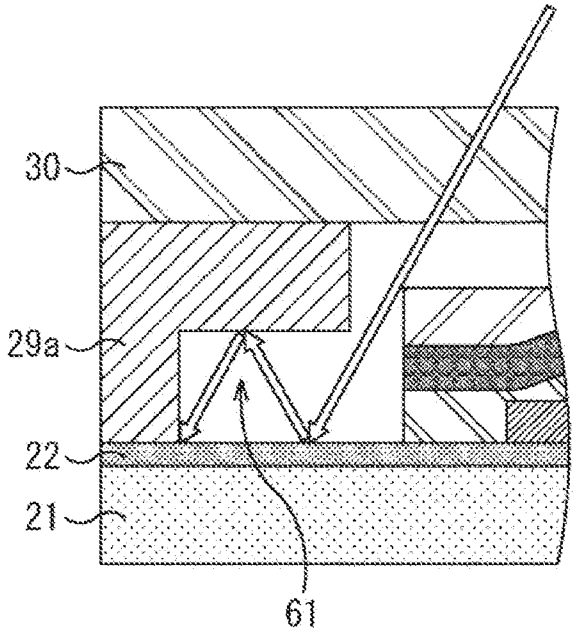
FIG. 12 is a view for illustrating how a flare is reduced by the shape of a support portion.
Figure 12:
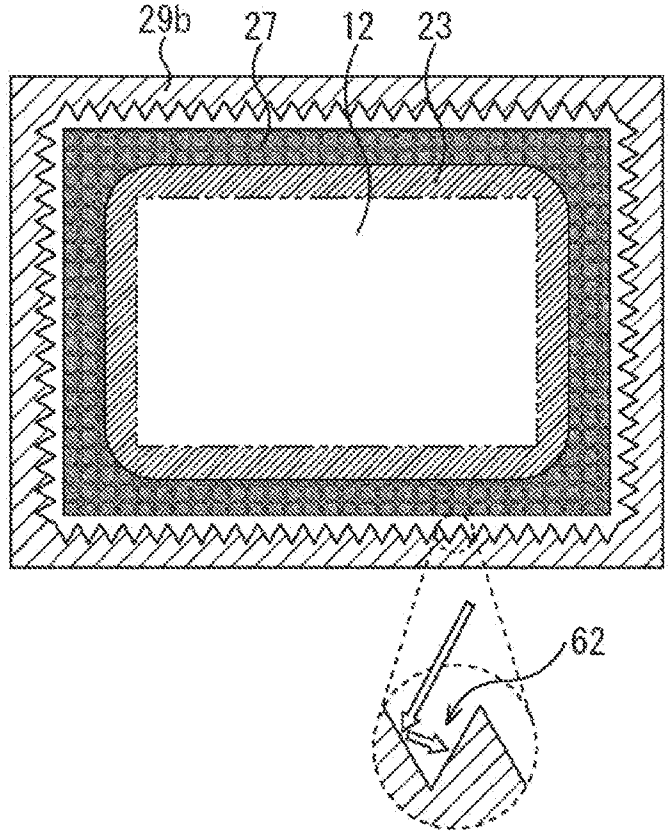

FIG. 12 is a view for illustrating how to reduce flare by the shape of the support portion 29.

The support portion 29*a* shown in FIG. 12 at A is formed in such a shape that the width of the lower part is smaller, and the width of the upper part is greater (an overhang shape having an upper part projecting toward the inner periphery). As illustrated, because of the shape of the support portion 29*a*, a recess 61 is defined by the support portion 29*a* and the antireflection layer 22. Light incident on the recess 61 is absorbed and attenuated by multiple reflection in the recess 61 as indicated by the outline arrows, which can reduce flare.

The support portion 29*a* can be formed in two parts as the upper and lower parts, and different materials may be used for the upper and lower parts.

The support portion 29*b* shown in FIG. 12 at B is formed in an uneven structure (jagged) on its inner surface. As shown in the enlarged figure, light incident in the recess 62 of the uneven structure at the inner peripheral surface of the support portion 29*b* is absorbed and attenuated by multiple reflection in the recess 62 as indicated by the outline arrows, which can reduce flare.

Note that the support portions 29*a* and 29*b* each having a shape that causes light to be reflected multiple times are formed, so that flare generation can be reduced, and images with better image quality can be captured.

Meanwhile, in a structure in which the support portion 29 is stacked on the antireflection layer 22 as in the imaging element package 11 in each of the variations described above, the bonding strength between the support portion 29-2 and the antireflection layer 22 is secured. In contrast, a structure that reduces flare for example by providing an organic layer having a light-shielding property between the antireflection layer 22 and the support portion 29 may be considered.

Now, with reference to FIGS. 13 to 16, in the following description, the bonding strength to the support portion 29 is further increased in the structure having an organic layer between the antireflection layer 22 and the support portion 29.

Figure 13:
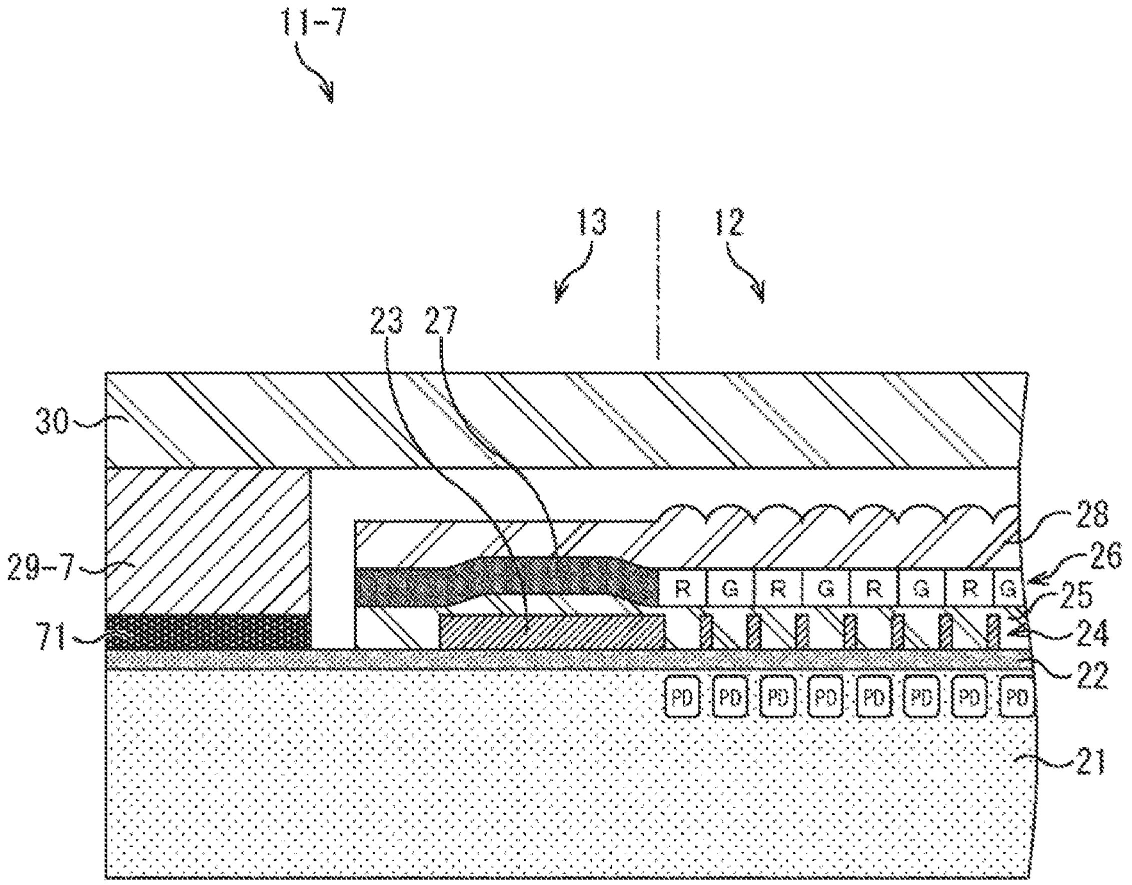
FIG. 13 is a cross-sectional view of an exemplary configuration of a seventh variation of the first embodiment.

FIG. 13 is a cross-sectional view of an exemplary configuration of a seventh variation of the imaging element package 11. In the imaging element package 11-7 shown in FIG. 13, the same elements as those of the imaging element package 11 shown in FIG. 1 are designated by the same reference characters, and their detailed descriptions will not be provided.

As shown in FIG. 13, the imaging element package 11-7 includes a light-shielding resin layer 71 formed on an antireflection layer 22 provided on the light-receiving surface of a semiconductor substrate 21 and a support portion 29-7 stacked on the light-shielding resin layer 71. The light-shielding resin layer 71 is made of a resin including a material having a light-shielding property by a black coloring agent which includes for example one of titanium black and carbon black. For example, the content of the black coloring agent in the light-shielding resin layer 71 is preferably 50% to 90% by mass.

In the imaging element package 11-7, the support portion 29-7 includes a porous material with micropores. This allows the structure to have air permeability. For example, silicon resin, acrylic resin, styrene resin, or epoxy resin can be used for the porous material that forms the support portion 29-7. In this way, for example, when the pressure inside the imaging element package 11-7 increases, the pressure increase can be reduced as vapor passes through the micropores in the support portion 29-7.

Therefore, the imaging element package 11-7 can have greater bonding strength to the support portion 29-7 even when the light-shielding resin layer 71 is provided between the antireflection layer 22 and the support portion 29-7. The imaging element package 11-7 can reduce reflection of light by the light-shielding resin layer 71 provided between the antireflection layer 22 and the support portion 29-7, so that images with better image quality can be captured.

Figure 14:
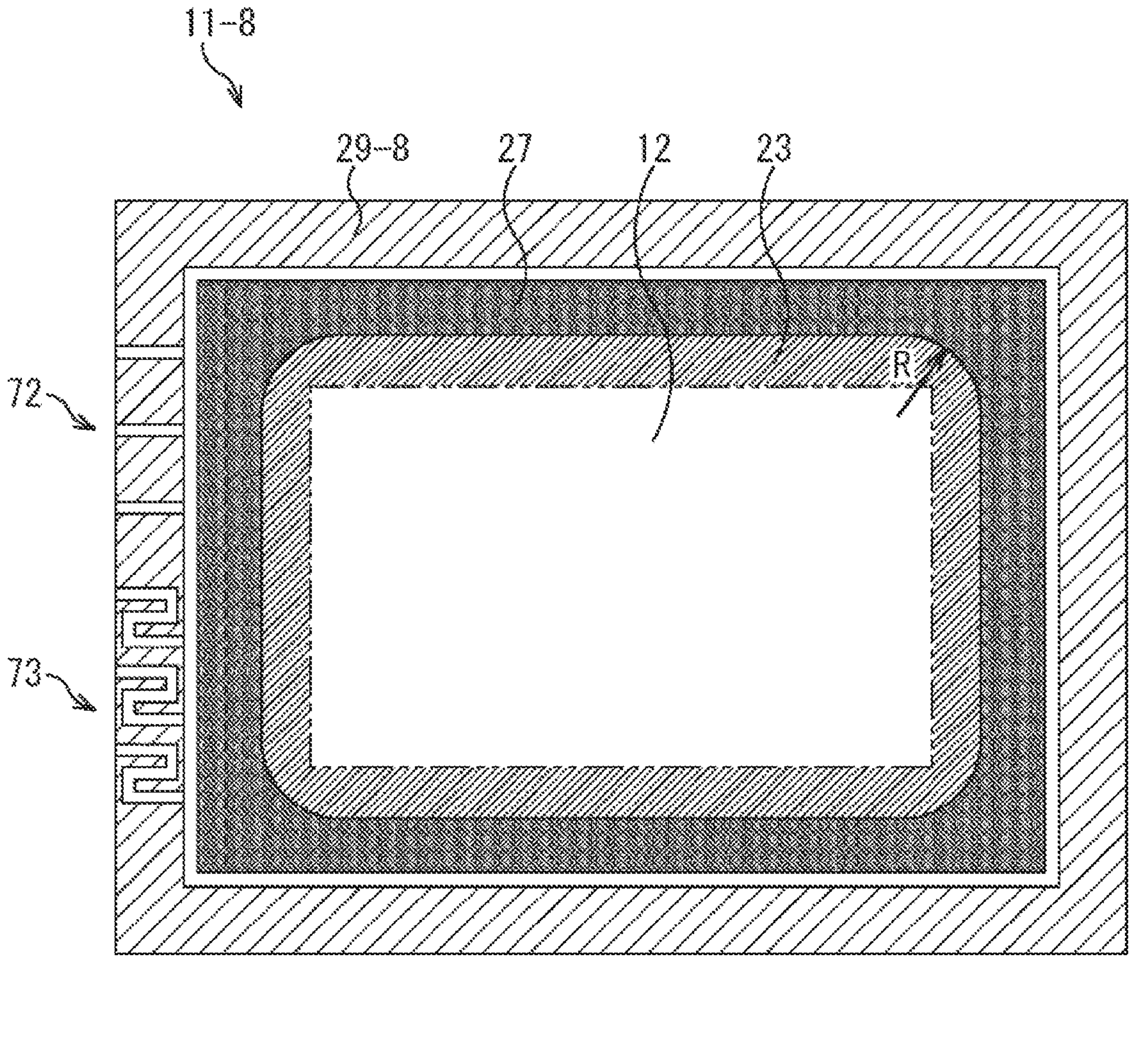
FIG. 14 is a cross-sectional view of an exemplary configuration of an eighth variation of the first embodiment.

FIG. 14 is a cross-sectional view of an exemplary configuration of an eighth variation of the imaging element package 11. Note that in the imaging element package 11-8 shown in FIG. 14, the same elements as those of the imaging element package 11 in FIG. 2 are designated by the same reference characters and their detailed descriptions will not be provided. In the imaging element package 11-8, a light-shielding resin layer 71 is provided between an antireflection layer 22 and a support portion 29 similarly to the imaging element package 11-7 shown in FIG. 13.

As shown in FIG. 14, the imaging element package 11-8 has a configuration with air permeability by providing ventilation structures 72 and 73 in a support portion 29-8. The ventilation structure 72 is a linear micro-tunnel, and the ventilation structure 73 is a micro-tunnel in a folded shape (maze-like shape). The micro-tunnels that serve as the ventilation structures 72 and 73 should have their dimensions designed in consideration of viscosity to prevent for example an underfill material from passing through.

In other words, the tunnel length h required for the micro-tunnel is determined by the following expression (1) where T represents the surface tension of the underfill material, θ the contact angle of the underfill material, ρ the liquid density of the underfill material, g the gravitational acceleration, and r the inner size (radius) of the micro-tunnel.

[Math. 1]

$$h > \frac{2T\cos\theta}{\rho gr} \quad (1)$$

Note that one of the ventilation structures 72 and 73 may be provided at the support portion 29-8. The ventilation structures 72 and 73 may be provided on a part of the support portion 29-8 (only on one side as illustrated) or on the entire support portion 29-8 (on all of the four sides).

In this way, when for example the pressure inside the imaging element package 11-8 increases, the pressure increase can be reduced as vapor that passes through the ventilation structures 72 and 73 provided in the support portion 29-8.

Therefore, the imaging element package 11-8 can have greater bonding strength to the support portion 29-8 even when the light-shielding resin layer 71 is provided between the antireflection layer 22 and the support portion 29-8. The imaging element package 11-8 can then reduce light reflection by the light-shielding resin layer 71 provided between the antireflection layer 22 and the support portion 29-8, so that images with better quality can be captured.

Figure 15:
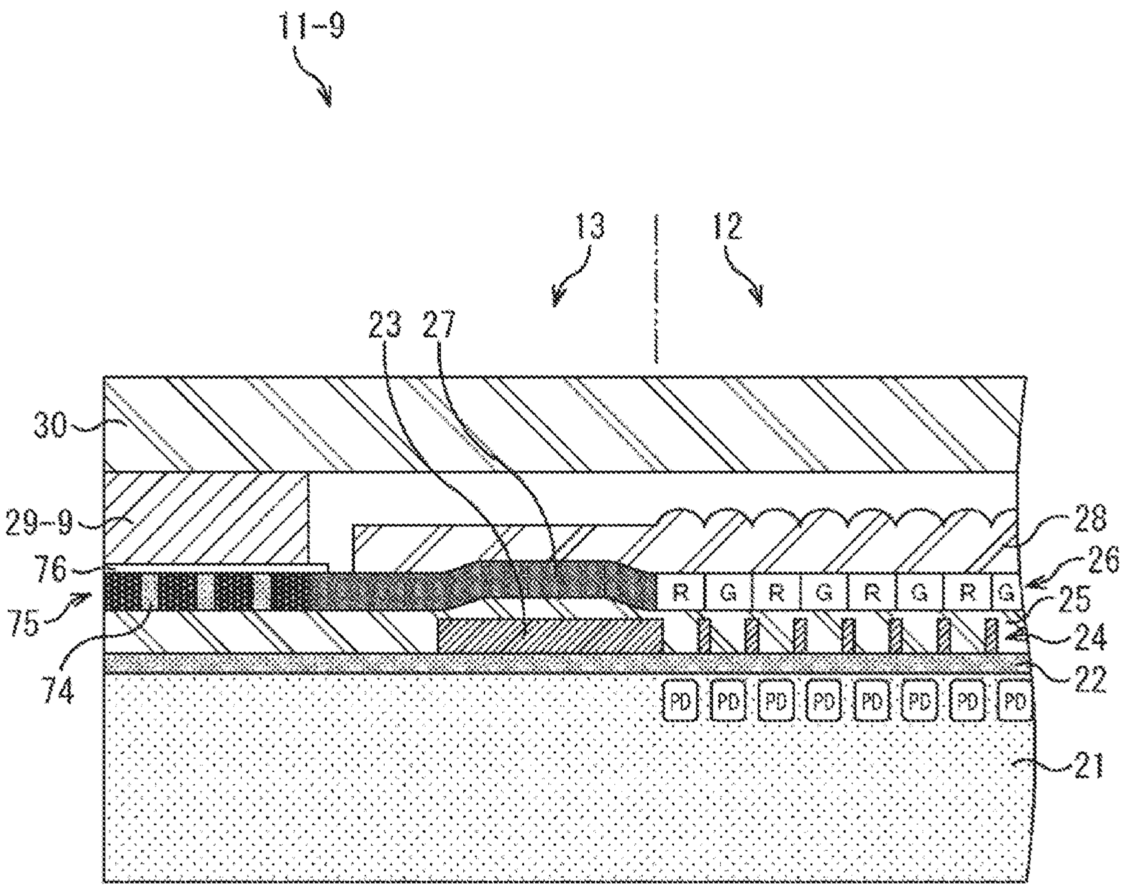
FIG. 15 is a cross-sectional view of an exemplary configuration of a ninth variation of the first embodiment.

FIG. 15 is a cross-sectional view of an exemplary configuration of a ninth variation of the imaging element package 11. In the imaging element package 11-9 shown in FIG. 15, the same elements as those of the imaging element package 11 in FIG. 1 are designated by the same reference characters and the detailed description will not be provided.

As shown in FIG. 15, in the imaging element package 11-9, a lattice-shaped oxide layer 74 is formed on the antireflection layer 22 provided on the light-receiving surface of the semiconductor substrate 21, and a light-shielding resin layer 75 divided into smaller portions to fill the space between the lattice-shaped oxide layer 74 is formed. For example, the width of the lattice of the oxide layer 74 is desirably from 1 μm to 5 μm from an optical viewpoint and a stress relaxation viewpoint. Then, an oxide layer 76 is formed to cover the oxide layer 74 and the light-shielding resin layer 75, and the support portion 29-9 is stacked on the oxide layer 76. Similarly to the light-shielding resin layer 71, the light-shielding resin layer 75 is made of a resin including a material having a light-shielding property for example by a black coloring agent.

Note that an organic layer that transmits light with a wavelength of 400 μm to 450 μm or an organic layer that absorbs light in the entire visible light range and near-infrared light range can be used for the light-shielding resin layer 75.

For example, the interfaces between oxide layers have substantially the same linear expansion coefficient and are not subject to stress due to thermal changes. Meanwhile, since the light-shielding resin layer 75 and the oxide layer 76 have different linear expansion coefficients and are subject to stress due to thermal changes, the stress load due to such thermal changes must be reduced and the bonding strength must be increased. Therefore, in the imaging element package 11-9, the light-shielding resin layer 75 is divided by the lattice-shaped oxide layer 74 into individual parts of light-shielding resin layer 75 each having a small volume. As a result, the amount of shrinkage at the boundary between the light-shielding resin layer 75 and the oxide layer 76 can be reduced, and the stress load due to thermal changes can be reduced.

Therefore, even when the light-shielding resin layer 75 is provided between the antireflection layer 22 and the support portion 29-9, the imaging element package 11-9 may have increased bonding strength to the support portion 29-9. In the imaging element package 11-9, the light-shielding resin layer 75 between the antireflection layer 22 and the support portion 29-9 can reduce reflection light, and images with better image quality can be captured.

Figure 16:
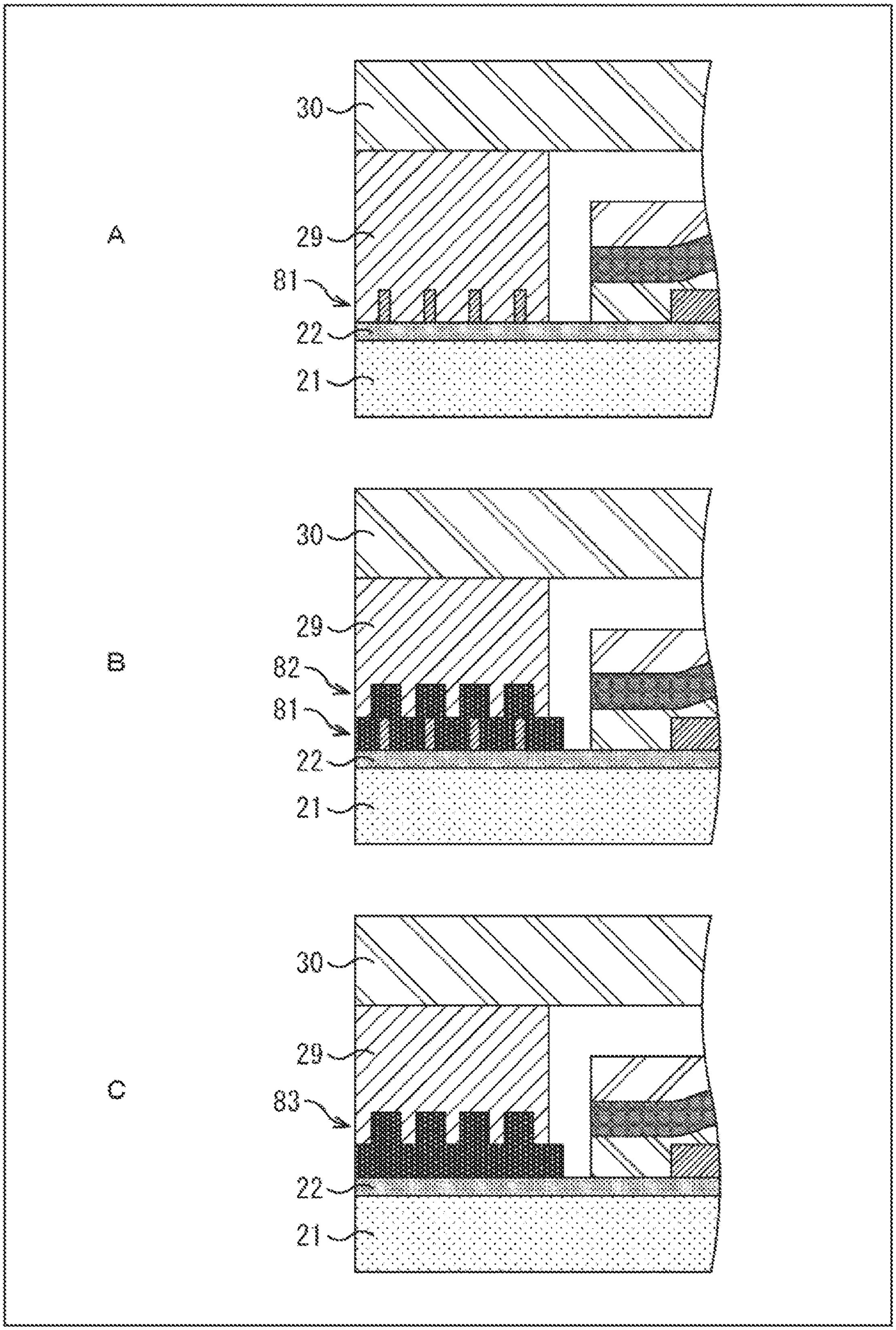
FIG. 16 is a view for illustrating the peeling prevention structure of the support portion.

FIG. 16 is a view of an anti-peeling structure that prevents peeling of the support portion 29 by forming the lower surface of the support portion 29 into an uneven shape.

The support portion 29 shown in FIG. 16 at A has a plurality of light-shielding layers 81 having a raised shape with respect to the antireflection layer 22, and an uneven structure is formed on the lower surface of the support portion 29 to engage with the light-shielding layers 81.

The support portion 29 shown in FIG. 16 at B has the plurality of light-shielding layers 81 having a raised shape on the antireflection layer 22, and a light-shielding resin layer 82 is formed to cover the light-shielding layers 81, so that the uppermost surface of the light-shielding resin layer 82 is formed into an uneven shape, and an uneven structure is formed under the support portion 29 to engage with the uneven shape.

In the support portion 29 shown in FIG. 16 at C, a light-shielding resin layer 83 having an uneven shaped upper surface is formed on the antireflection layer 22, and an uneven structure is formed on the lower surface of the support portion 29 to engage with the uneven shape.

For example, the light-shielding resin layers 82 and 83 can be formed by consecutive coating and exposure (carrying out coating and expose twice) or by half-exposure at a time. The width of the uneven structure formed on the lower surface of the support portion 29 is preferably from 1 μm to 5 μm, and the depth of the uneven structure is preferably from 200 nm to 1 μm. Specifically, the uneven structure can be easily formed in the process formation by carrying out patterning with a width and a depth substantially the same as those of the effective pixels. Note that the light-shielding layer 81, the light-shielding layer 81 and the light-shielding resin layer 82, or the light-shielding resin layer 83 may be formed in an area other than the area where the support portion 29 is provided.

In this way, an anchor effect can be provided by the engagement of the uneven structure formed on the underside of the support portion 29, and the support portion 29 can be prevented from peeling off.

Second Exemplary Configuration of Imaging Element Package

Figure 17:
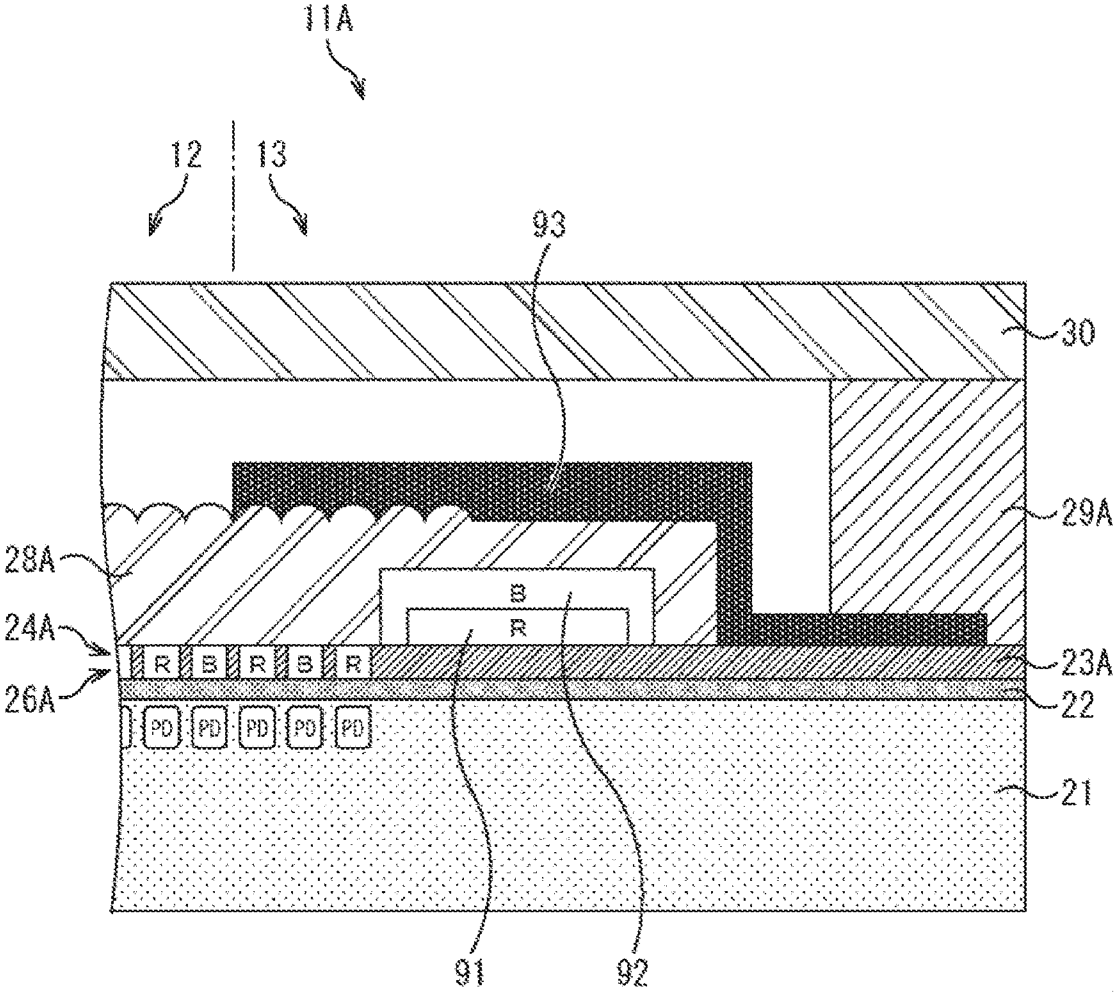
FIG. 17 is a cross-sectional view of an exemplary configuration of an imaging element package according to a second embodiment to which the present disclosure is applied.

FIG. 17 is a cross-sectional view of an exemplary configuration of an imaging element package according to a second embodiment to which the present disclosure is applied.

In the imaging element package 11A shown in FIG. 17, the effective pixel area 12 is inside the boundary indicated by the double-dot chain line (on the left in the figure), and the peripheral area 13 is outside of the boundary (on the right in the figure). The effective pixel area 12 is the area where pixels effectively used for capturing images by the imaging element package 11A are provided, and the peripheral area 13 is the area provided outside the effective pixel area 12 in the peripheral part of the imaging element package 11A.

The imaging element package 11A includes a semiconductor substrate 21, an antireflection layer 22, a light-shielding layer 23A, an inter-pixel light-shielding layer 24A, a color filter layer 26A, an on-chip lens layer 28A, a support portion 29A, a cover glass 30, a flare prevention layer 91, a flare prevention layer 92, and a light-shielding resin layer 93.

The semiconductor substrate 21 is for example a silicon substrate on which a photodiode PD is provided for each pixel, and light emitted to the light-receiving surface of the semiconductor substrate 21 (the surface facing up in FIG. 17) is photoelectrically converted at the photodiode PD.

The antireflection layer 22 is provided on the light-receiving surface of the semiconductor substrate 21. The antireflection layer 22 is provided on the entire surface of the semiconductor substrate 21. The antireflection layer 22 may include a silicon oxide film deposited by deposition processing. In this way, the antireflection layer 22 prevents reflection of light at the light-receiving surface of the semiconductor substrate 21.

The light-shielding layer 23A and the inter-pixel light-shielding layer 24A are provided by depositing a metal material having a light-shielding property such as tungsten and aluminum. The light-shielding layer 23A is provided in the peripheral area 13, and the inter-pixel light-shielding layer 24A is provided between adjacent pixels in the effective pixel area 12. For example, in the imaging element package 11A, the light-shielding layer 23A is provided up to the edge of the semiconductor substrate 21. In the imaging element package 11A, the pixels provided in the peripheral area 13 are light-shielded by the light-shielding resin layer 93 and therefore not used for capturing images but used for example for detecting an optical black level.

The color filter layer 26A includes, for each of a plurality of pixels, a filter (such as a filter R that transmits red light, a filter G that transmits green light, and a filter B that transmits blue light) that transmits light received by the pixel and is made of a resin containing an organic pigment of a color. In the imaging element package 11A, the color filter layer 26A is configured so that the individual filters are arranged between the inter-pixel light-shielding layer 24A.

The on-chip lens layer 28A includes an arrangement of micro-lenses to collect light for each pixel. In the peripheral part of the on-chip lens layer 28A, the lens material without micro-lenses is stacked on the flare prevention layer 92 and the light-shielding layer 23A.

The support portion 29A is a structure provided along the outer periphery of the semiconductor substrate 21 and is made of a resin material that supports the cover glass 30.

The cover glass 30 protects the light-receiving surface of the semiconductor substrate 21.

The flare prevention layer 91 and the flare prevention layer 92 are resin layers that are stacked on the light-shielding layer 23A and absorb light to reduce reflection of light at the light-shielding layer 23A, so that flare generation is prevented. As illustrated, the flare prevention layer 91 is stacked on the light-shielding layer 23A, the flare prevention layer 92 is stacked to cover the flare prevention layer 91, and the on-chip lens layer 28A is stacked to cover the flare prevention layer 92. For example, the flare prevention layer 91 includes a resin containing a red organic pigment similar to that of the filter R, and the flare prevention layer 91 includes a resin containing a blue organic pigment similar to that of the filter B.

Note that for example the flare prevention layers 91 and 92 may both include a resin containing a blue organic pigment similar to that of the filter B. The flare prevention layer 91 may include a resin containing a green organic pigment similar to that of the filter G, and the flare prevention layer 91 may include a resin containing a blue organic pigment similar to that of the filter B. Furthermore, a three-layer structure including resins containing a blue organic pigment, a red organic pigment, and a green organic pigment may be provided.

The light-shielding resin layer 93 is stacked to cover the on-chip lens layer 28A and the light-shielding layer 23A outside the boundary between the effective pixel area 12 and the peripheral area 13. For example, the light-shielding resin layer 93 is provided on the uppermost surface in the pixel outer periphery and up to several micrometers outside of the effective pixels. For example, the light-shielding resin layer 93 includes a resin containing a material having a light-shielding property by a black coloring agent including one of titanium black and carbon black.

The imaging element package 11A has the configuration and provided with the light-shielding resin layer 93 on the uppermost surface of the peripheral area 13. In this way, the presence of the light-shielding resin layer 93 allows stray light incident outside the pixels to be absorbed by the light-shielding resin layer 93, so that the stray light can be prevented from being reflected back to the effective pixels and flare can be reduced.

The imaging element package 11A having the configuration has the light-shielding resin layer 93 provided at the uppermost surface of the peripheral area 13 to reduce reflection of light at the peripheral area 13, so that flare generation can be reduced and images with better image quality can be captured.

As illustrated, the imaging element package 11A has such a structure that the lens material of the on-chip lens layer 28A and the color filter layer 26A that may come off are not stacked under the support portion 29A. This prevents the support portion 29A from peeling and improves the reliability and resistance of the imaging element package 11A.

Figure 18:
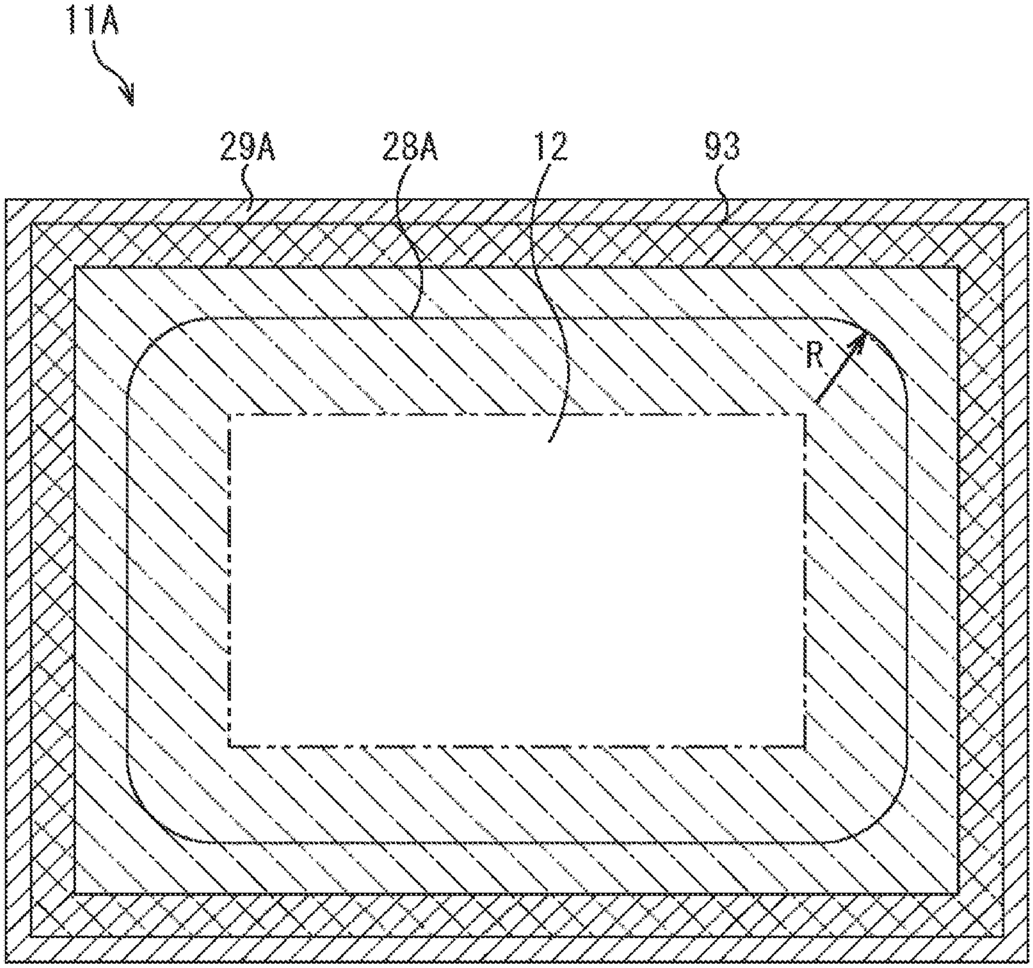
FIG. 18 is a plan view of an imaging element package in FIG. 17.

FIG. 18 is a plan view of the imaging element package 11A.

As shown in FIG. 18, in the imaging element package 11A, a light-shielding resin layer 93 (hatched by dashed-dotted lines in FIG. 18) is provided outside of the boundary of the effective pixel area 12 indicated by the double-dot chain line. In the imaging element package 11A, the light-shielding resin layer 93 is provided from the vicinity of the boundary between the effective pixel area 12 and the peripheral area 13 to the area overlapping the support portion 29A.

In the imaging element package 11A, the on-chip lens layer 28A is formed to have such an outer peripheral shape that the four corners are rounded into an arc shape with a prescribed radius of curvature R.

Figure 19:
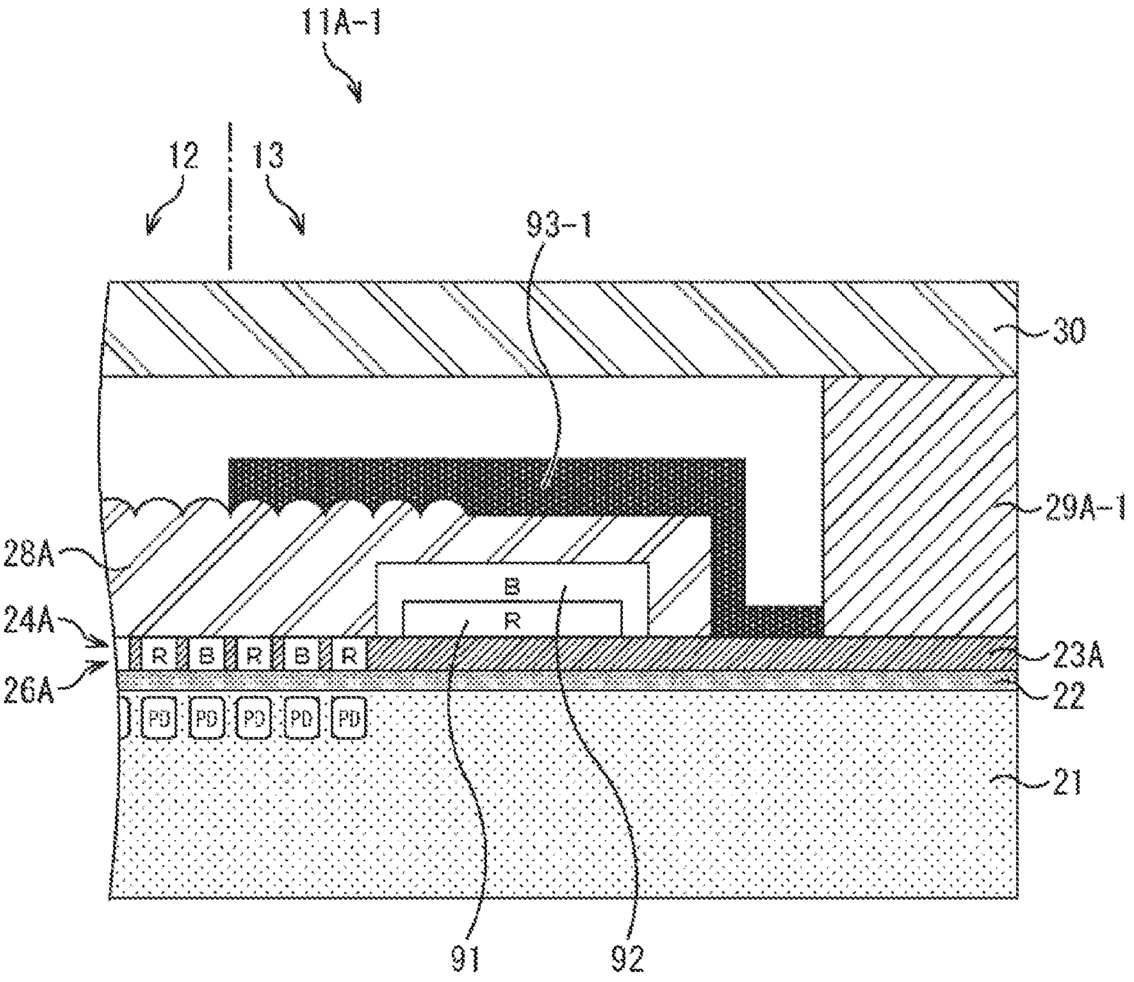
FIG. 19 is a plan view of an exemplary configuration of a first variation of the second embodiment.

FIG. 19 is a cross-sectional view of an exemplary configuration of a first variation of the imaging element package 11A. In the imaging element package 11A-1 shown in FIG. 19, the same elements as those of the imaging element package 11A in FIG. 17 are designated by the same reference characters, and their detailed descriptions will not be provided.

As shown in FIG. 19, the imaging element package 11A-1 has the same configuration as the imaging element package 11A in FIG. 17 in that a light-shielding resin layer 93-1 is formed on the uppermost surface of the peripheral area 13. More specifically, similarly to the imaging element package 11A in FIG. 17, the imaging element package 11A-1 can capture images with better quality by a structure that reduces flare generation in the peripheral area 13.

The imaging element package 11A-1 has a different configuration from the imaging element package 11A in FIG. 17 in that the light-shielding resin layer 93-1 is not provided under the support portion 29A-1. More specifically, in the imaging element package 11A-1, the light-shielding resin layer 93-1 is provided as far as before the support portion 29A-1, and the support portion 29A-1 is stacked on the light-shielding layer 23A.

Therefore, the imaging element package 11A-1 having the configuration can reduce the peeling of the support portion 29A-1 more than the imaging element package 11A in FIG. 17, and can improve the reliability and resistance.

Figure 20:
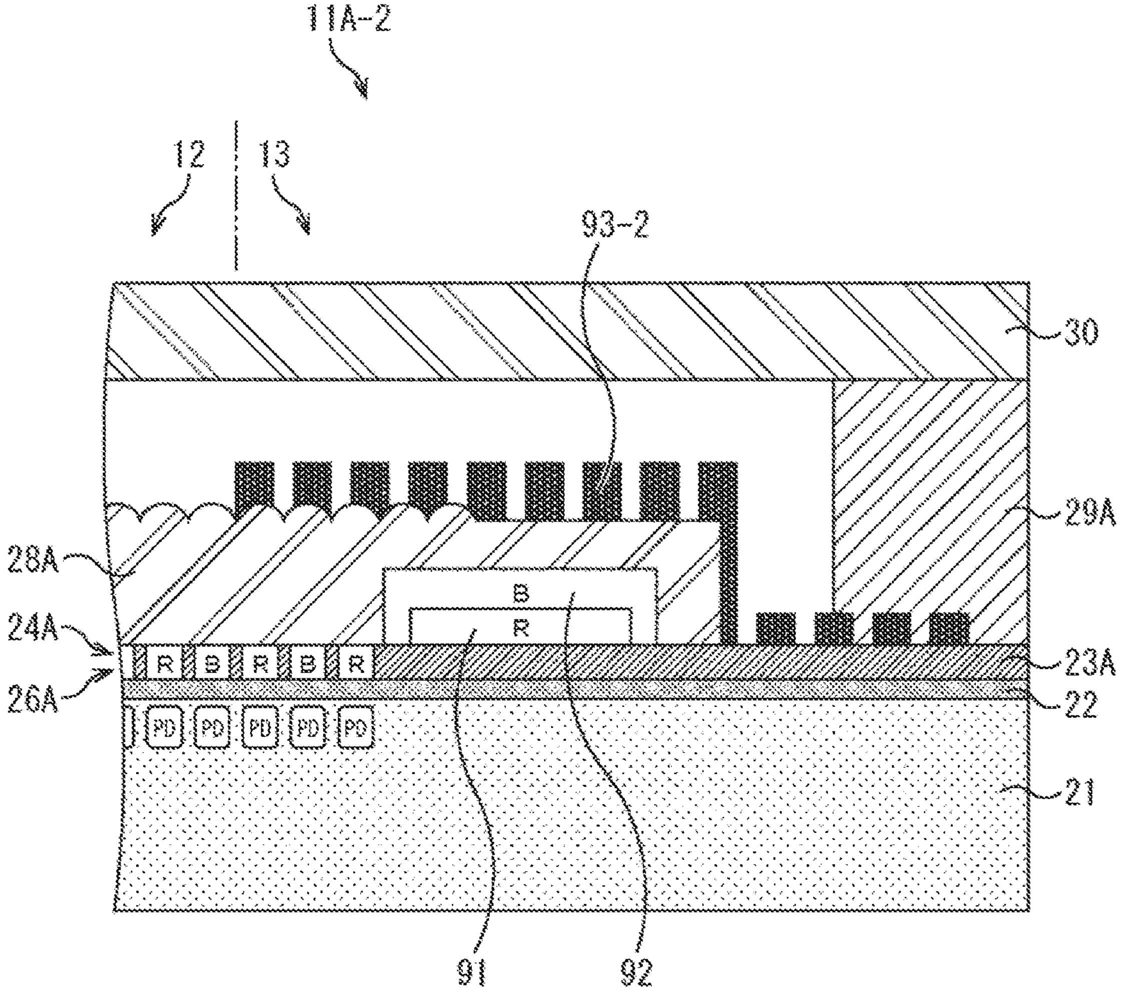
FIG. 20 is a plan view of an exemplary configuration of a second variation of the second embodiment.

FIG. 20 is a cross-sectional view of a second variation of the imaging element package 11A. In the imaging element package 11A-2 shown in FIG. 20, the same elements as those of the imaging element package 11A in FIG. 17 are designated by the same reference characters, and their detailed descriptions will not be provided.

As shown in FIG. 20, the imaging element package 11A-2 has the same configuration as the imaging element package 11A in FIG. 17, in that a light-shielding resin layer 93-2 is formed on the uppermost surface of the peripheral area 13. In other words, similarly to the imaging element package 11A in FIG. 17, the imaging element package 11A-2 can capture images with better quality by a structure that reduces flare generation in the peripheral area 13.

In the imaging element package 11A-2, the light-shielding resin layer 93-2 has a different structure from the imaging element package 11A in FIG. 17 in that the former is patterned by providing slits. For example, by patterning the light-shielding resin layer 93-2, it is expected that light entering the slits therein can be confined and that reflected components can be scattered as much as possible, so that flare generation can be further reduced.

Accordingly, the imaging element package 11A-2 having the configuration can capture images with good image quality while flare is even more reduced because of the patterned light-shielding resin layer 93-2.

Figure 21:
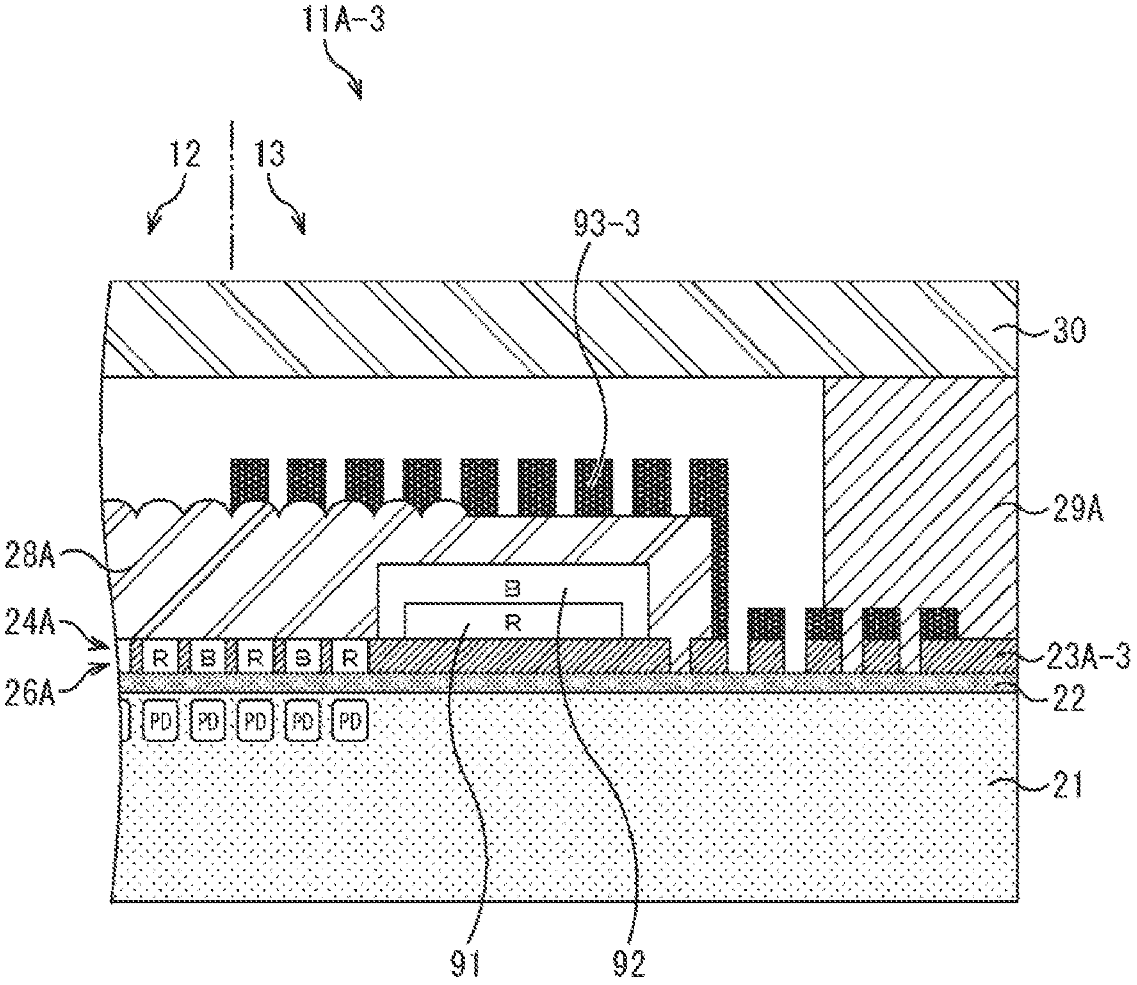
FIG. 21 is a plan view of an exemplary configuration of a third variation of the second embodiment.

FIG. 21 is a cross-sectional view of an exemplary configuration of a third variation of the imaging element package 11A. In the imaging element package 11A-3 shown in FIG. 21, the same elements as those of the imaging element package 11A in FIG. 17 are designated by the same reference characters, and their detailed descriptions will not be provided.

As shown in FIG. 21, the imaging element package 11A-3 having the same configuration as the imaging element package 11A in FIG. 17 in that a light-shielding resin layer 93-3 is formed on the uppermost surface of the peripheral area 13. More specifically, similarly to the imaging element package 11A in FIG. 17, the imaging element package 11A-3 can capture images with better quality by a structure that reduces flare generation in the peripheral area 13.

The imaging element package 11A-3 has a different configuration from the imaging element package 11A shown in FIG. 17 in that the light-shielding resin layer 93-3 is patterned by providing slits, and slits are provided in the light-shielding layer 23A-3 at locations corresponding to the slits. For example, by patterning the light-shielding resin layer 93-3, the effect of confining the light entering the slits therein can be obtained and reflected components can be scattered as much as possible, light having passed through the slits in the light-shielding resin layer 93-3 can pass through the slits in the light-shielding layer 23A-3 and be absorbed by the semiconductor substrate 21, which may further reduce flare generation.

Therefore, the imaging element package 11A-3 having the configuration can capture images with good image quality with further reduced flare because of the patterned light-shielding resin layer 93-3 and the light-shielding layer 23A-3.

Figure 22:
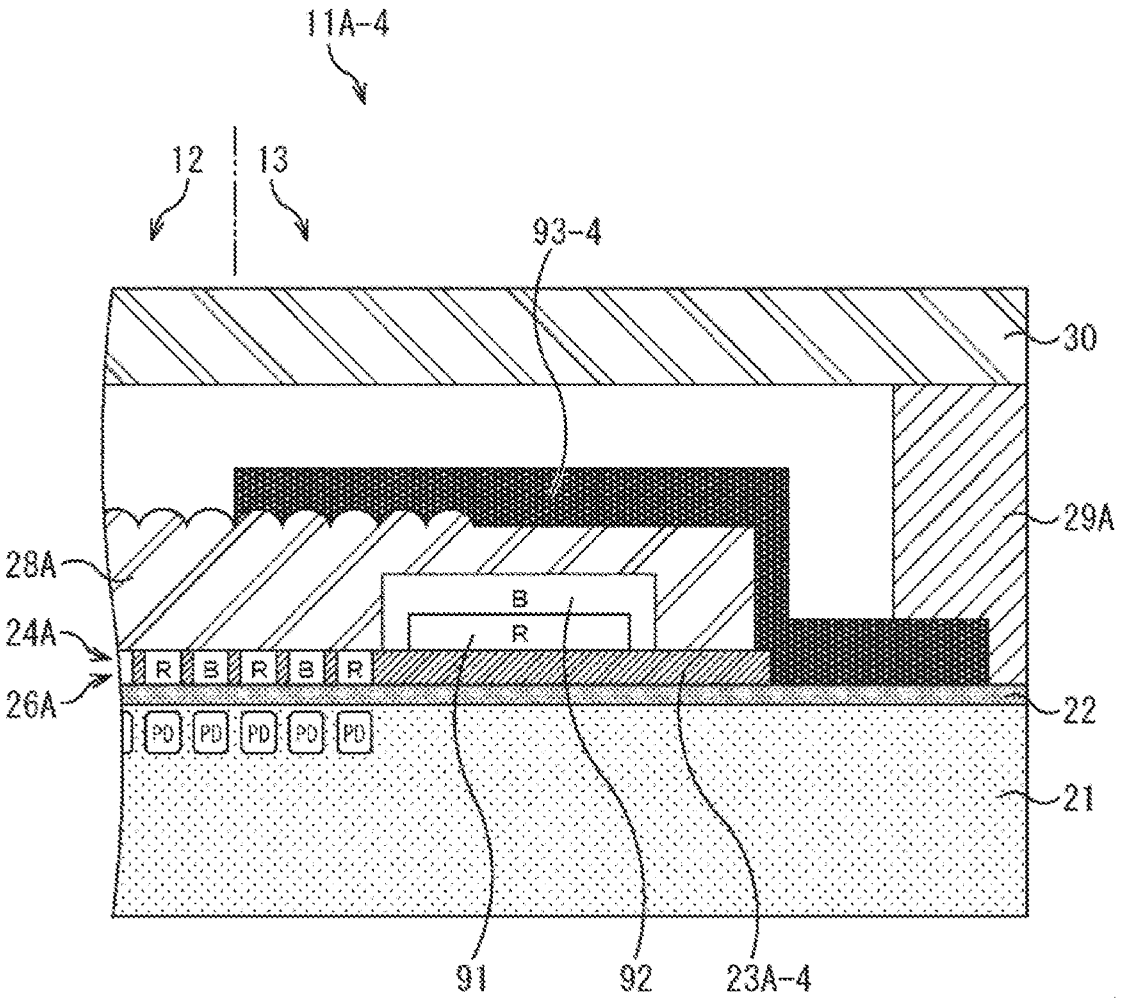
FIG. 22 is a plan view of an exemplary configuration of a fourth variation of the second embodiment.

FIG. 22 is a cross-sectional view of an exemplary configuration of a fourth variation of the imaging element package 11A. In the imaging element package 11A-4 shown in FIG. 22, the same elements as those of the imaging element package 11A in FIG. 17 are designated by the same reference characters, and their detailed descriptions will not be provided.

As shown in FIG. 22, the imaging element package 11A-4 has the same configuration as the imaging element package 11A in FIG. 17 in that a light-shielding resin layer 93-4 is formed on the uppermost surface of the peripheral area 13. More specifically, similarly to the imaging element package 11A in FIG. 17, the imaging element package 11A-4 can capture images with better quality by a structure that reduces flare generation in the peripheral area 13.

The imaging element package 11A-4 has a different configuration from the imaging element package 11A in FIG. 17 in that the light-shielding layer 23A-4 extends approximately to the edge of the lens material of the on-chip lens layer 28A. For example, in the imaging element package 11A in FIG. 17, the light-shielding layer 23A is provided up to the edge of the semiconductor substrate 21, while in the imaging element package 11A-4, the light-shielding layer 23A-4 is set back as much as possible.

More specifically, in the imaging element package 11A in FIG. 17, there is a part where only the light-shielding resin layer 93 is stacked on the light-shielding layer 23A, and light may be reflected by the light-shielding layer 23A in the part. In contrast, the imaging element package 11A-4 has no such part, and the on-chip lens layer 28A and the light-shielding resin layer 93 are stacked at least on the light-shielding layer 23A-4, so that a reduction in reflection of light by the light-shielding layer 23A-4 is expected.

Accordingly, the imaging element package 11A-4 having the configuration can reduce reflection of light by the light-shielding layer 23A-4 more than the imaging element package 11A in FIG. 17 and can capture images with good image quality and with reduced flare.

Figure 23:
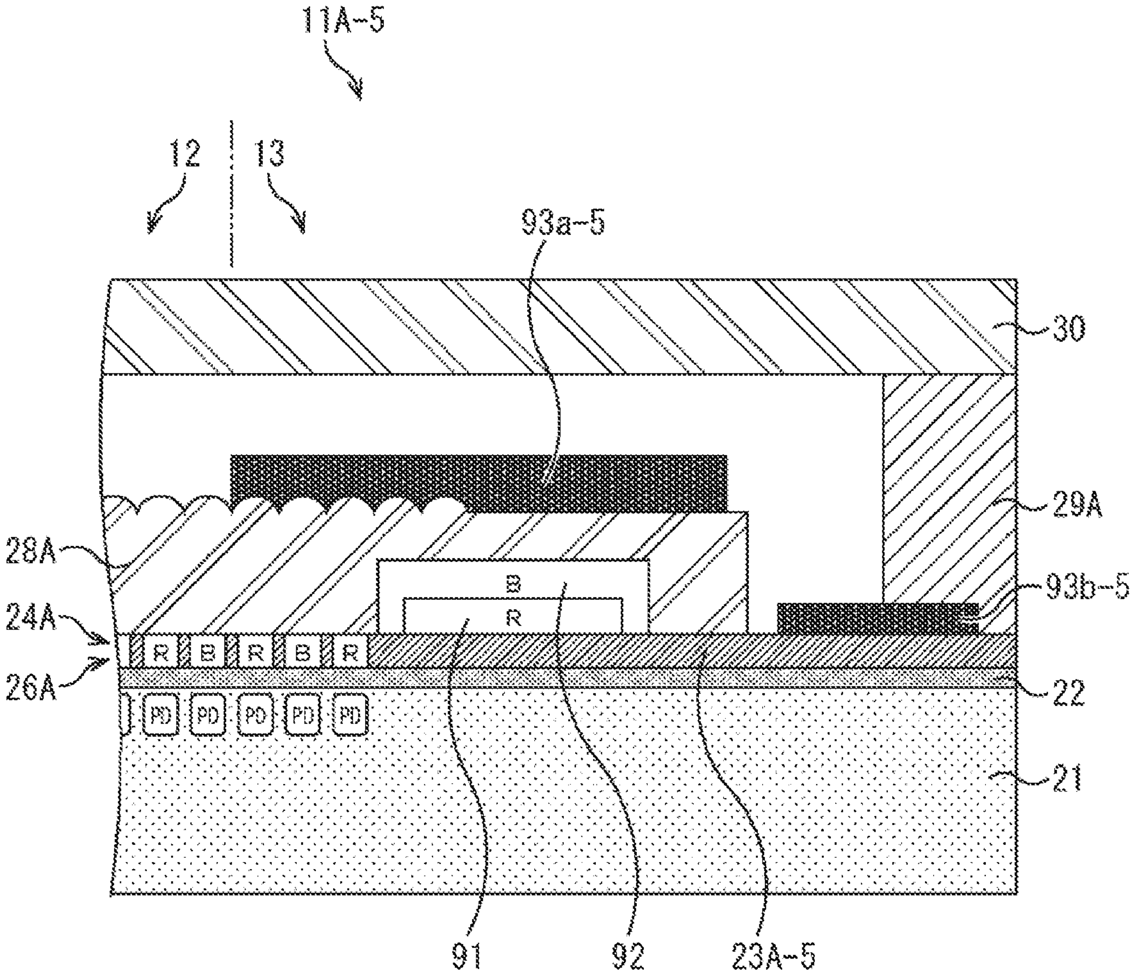
FIG. 23 is a plan view of an exemplary configuration of a fifth variation of the second embodiment.

FIG. 23 is a cross-sectional view of an exemplary configuration of a fifth variation of the imaging element package 11A. In the imaging element package 11A-5 shown in FIG. 23, the same elements as those of the imaging element package 11A in FIG. 17 are designated by the same reference characters, and their detailed descriptions will not be provided.

As shown in FIG. 23, the imaging element package 11A-5 has the same configuration as the imaging element package 11A in FIG. 17 in that a light-shielding resin layer 93-5 is formed on the uppermost surface of the peripheral area 13. More specifically, similarly to the imaging element package 11A in FIG. 17, the imaging element package 11A-5 can capture images with better quality by a structure that reduces flare generation in the peripheral area 13.

The imaging element package 11A-5 has a different configuration from the imaging element package 11A in FIG. 17 in that the light-shielding resin layer 93-5 is divided near the edge of the lens material of the on-chip lens layer 28A. More specifically, in the imaging element package 11A-5, the light-shielding resin layer 93-5 is divided into a light-shielding resin layer 93*a*-5 that is stacked on the on-chip lens layer 28A and a light-shielding resin layer 93*b*-5 that is stacked on the light-shielding layer 23A-5.

For example, the light-shielding resin layer 93-5 may become thicker at a stepped part such as the edge of the lens material of the on-chip lens layer 28A, and the part may not be exposed and chipping may result. Therefore, in the imaging element package 11A-5, the light-shielding resin layers 93*a*-5 and 93*b*-5 are provided separately in advance so that the light-shielding resin layer is not formed at the stepped part. Since the gap created by the separation is narrow, the effect of flare generation in the gap is considered to be negligible.

Therefore, the imaging element package 11A-5 having the configuration can capture images with good image quality and with reduced flare because of the light-shielding resin layers 93*a*-5 and 93*b*-5.

Figure 24:
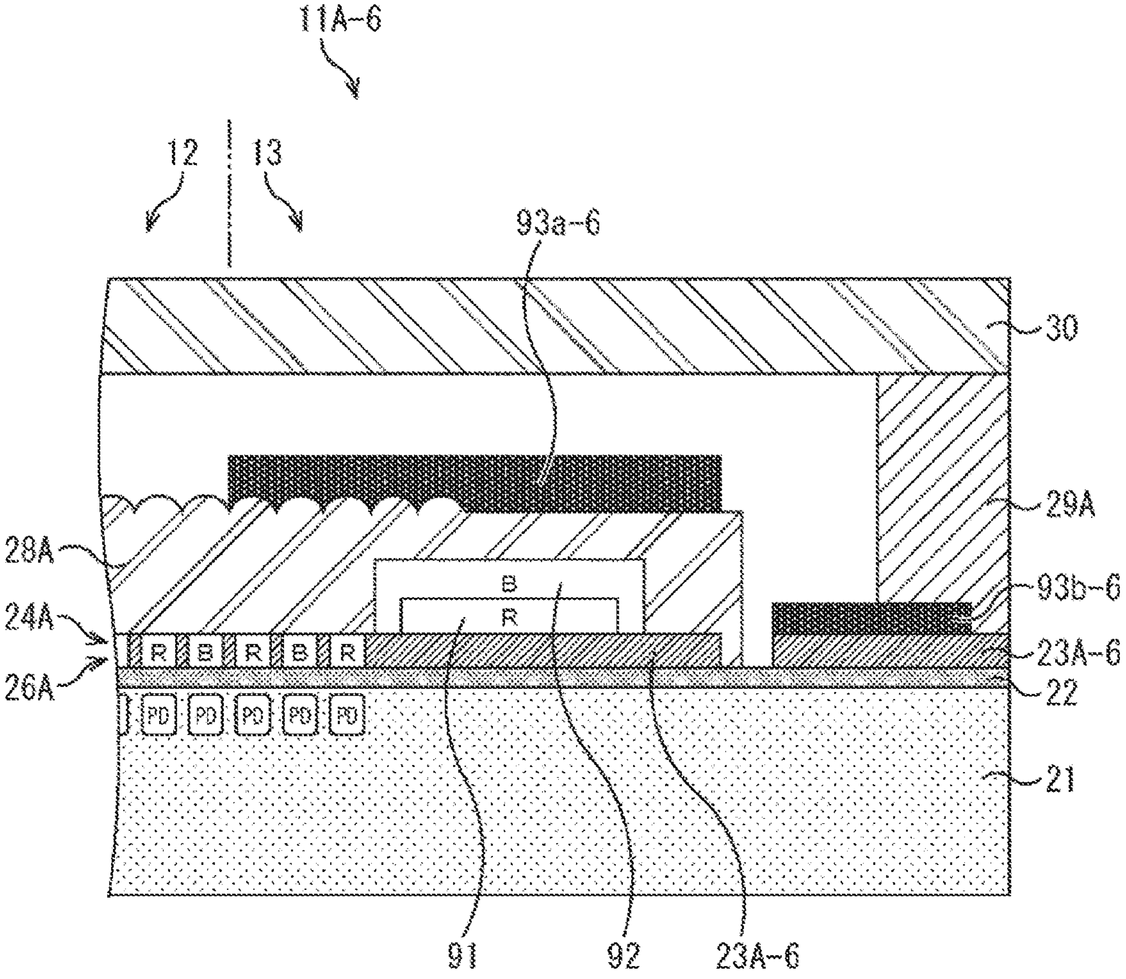
FIG. 24 is a plan view of an exemplary configuration of a sixth variation of the second embodiment.

FIG. 24 is a cross-sectional view of an exemplary configuration of a sixth variation of the imaging element package 11A. In the imaging element package 11A-6 shown in FIG. 24, the same elements as those of the imaging element package 11A in FIG. 17 are designated by the same reference characters, and their detailed descriptions will not be provided.

As shown in FIG. 24, the imaging element package 11A-6 has the same configuration as the imaging element package 11A in FIG. 17 in that a light-shielding resin layer 93-6 is formed on the uppermost surface of the peripheral area 13. More specifically, similarly to the imaging element package 11A in FIG. 17, the imaging element package 11A-6 can capture images with better quality by a structure that reduces flare generation in the peripheral area 13.

The imaging element package 11A-6 is different from the imaging element package 11A in FIG. 17 in that a light-shielding resin layer 93-6 and a light-shielding layer 23A-6 are separated near the edge of the lens material of the on-chip lens layer 28A. More specifically, in the imaging element package 11A-6, the light-shielding resin layer 93-6 is divided into a light-shielding resin layer 93*a*-6 that is stacked on the on-chip lens layer 28A and a light-shielding resin layer 93*b*-6 that is stacked on the light-shielding layer 23A-6, and the light-shielding resin layer 23A-6 is provided with a slit in locations corresponding to a slit in the light-shielding resin layer 93-6.

For example, the light-shielding resin layer 93-6 may become thicker at a stepped part such as the edge of the lens material of the on-chip lens layer 28A, the part may not be exposed and chipping may result. Therefore, in the imaging element package 11A-6, the light-shielding resin layers 93*a*-6 and 93*b*-6 are provided separately in advance so that the light-shielding resin layer is not formed at the stepped part. Since the gap created by the separation is narrow, the effect of flare generation in the gap is considered to be negligible.

Furthermore, by providing the slit in the light-shielding layer 23A-6 in a location corresponding to the slit in the light-shielding resin layer 93-6, light having passed through the slit in the light-shielding resin layer 93-6 can be absorbed by the semiconductor substrate 21 through the slit in the light-shielding layer 23A-6, which may further reduce flare.

Accordingly, the imaging element package 11A-6 having the configuration can capture images with good image quality and with reduced flare because of the light-shielding resin layer 93-6 and the light-shielding layer 23A-6.

Figure 25:
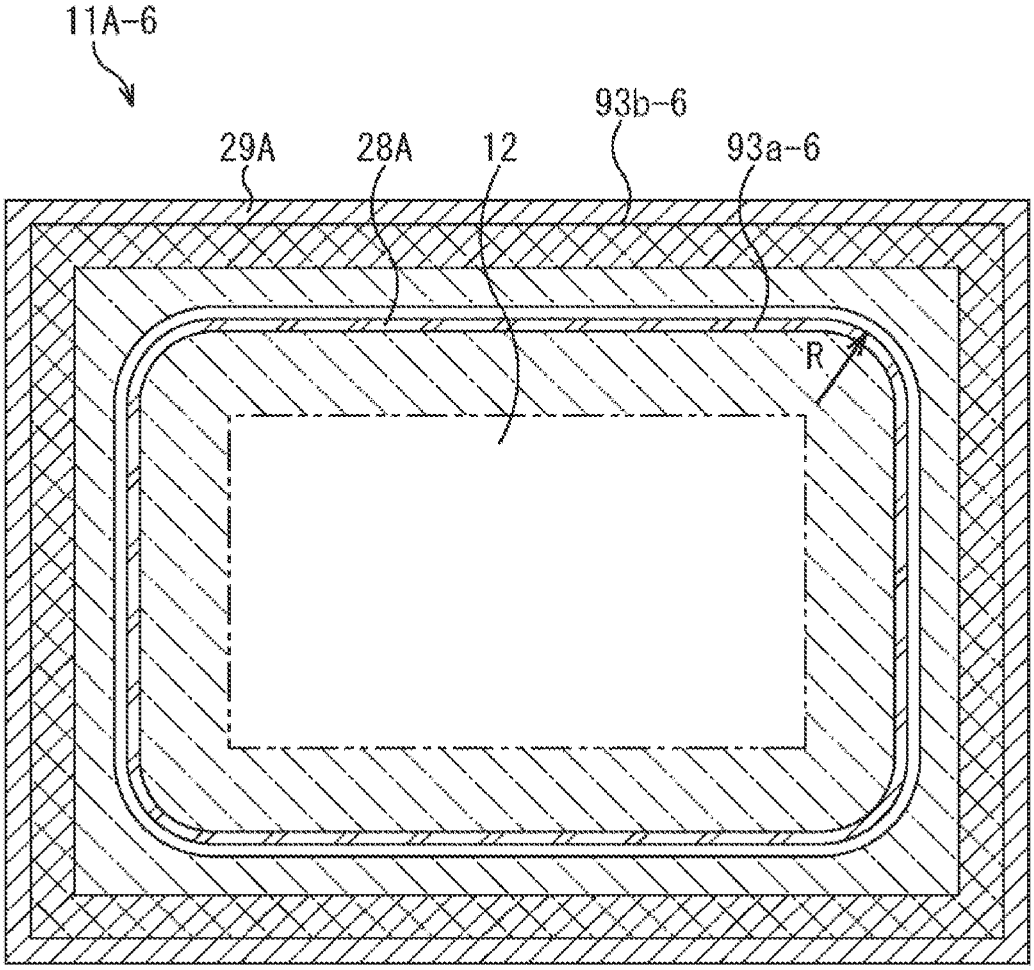
FIG. 25 is a plan view of an imaging element package in FIG. 24.

FIG. 25 is a plan view of the imaging element package 11A-6.

As shown in FIG. 25, in the imaging element package 11A-6, the light-shielding resin layer 93*a*-6 (hatched by single dot chain lines in FIG. 25) is provided outside from the boundary of the effective pixel area 12 shown by dashed-two dotted lines. Then, slits are provided in the light-shielding resin layer 93-6 near the edge of the lens material of the on-chip lens layer 28A, and the light-shielding resin layer 93*b*-6 (hatched by dashed-dotted lines in FIG. 25) is provided outside the slits.

Exemplary Configuration of Ventilation Path

With reference to FIGS. 26 to 34, an exemplary configuration of an imaging element package 11B having a ventilation path 101 will be described.

For example, a general wafer-level CSP (Chip Size Package) has a support portion 29 provided in a peripheral area 13 outside of an effective pixel area 12 and thus has an internal space (hereinafter referred to as a cavity) surrounded by a semiconductor substrate 21, the support portion 29, and a cover glass 30, and the cavity has an airtight package structure. However, in the package structure as described above, when for example the internal pressure of the cavity increases due to heat from reflow during mounting, stress is generated on the support portion 29. As a result, peeling may occur at the interface between the semiconductor substrate 21 and the support portion 29 or between the support portion 29 and the cover glass 30, or damage may occur inside the support portion 29 due to cohesive fracture.

Such a concern can be eliminated by the imaging element package 11B that includes a package structure that is not airtight because of the presence of a ventilation path 101 (hereinafter referred to as a "non-airtight package structure").

Figure 26:
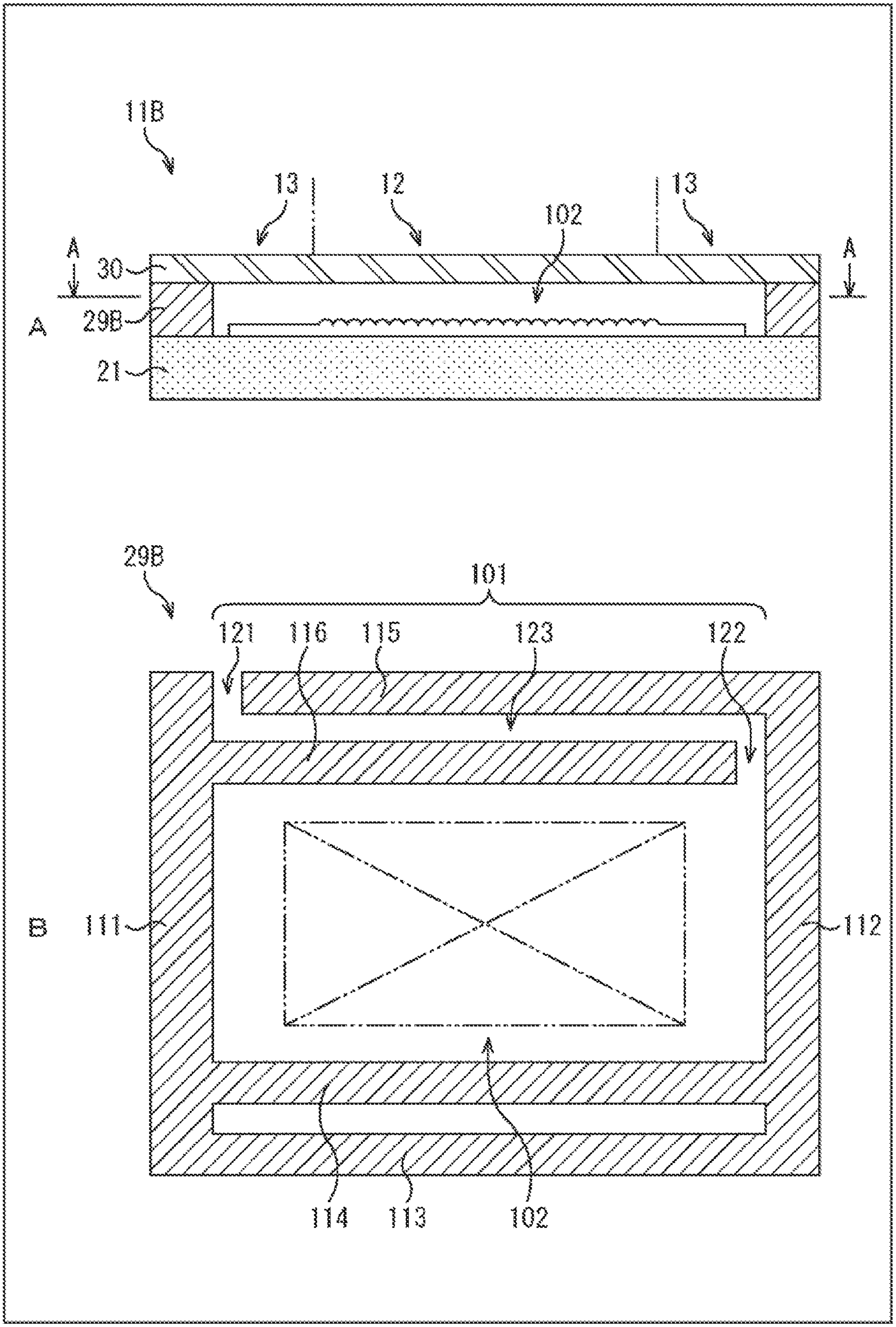
FIG. 26 is a view for illustrating an exemplary configuration of an imaging element package provided with a ventilation path.

FIG. 26 is a view for illustrating an exemplary configuration of the imaging element package 11B with the ventilation path 101. FIG. 26 at A is a cross-sectional view of the imaging element package 11B, and FIG. 26 at B shows a cross section of a support portion 29B taken along A-A in FIG. 26 at A.

As shown in FIG. 26 at A, similarly to the imaging element package 11 in FIG. 1, in the imaging element package 11B, an effective pixel area 12 is inside the boundary indicated by the double-dot chain line, and a peripheral area 13 is outside of the boundary. In addition, similarly to the imaging element package 11 in FIG. 1, the imaging element package 11B is configured so that the cover glass 30 is supported by the support portion 29B provided along the outer periphery of the semiconductor substrate 21. Accordingly, the internal space surrounded by the semiconductor substrate 21, the support portion 29B, and the cover glass 30 is defined as the cavity 102.

In FIG. 26 at A, the semiconductor substrate 21, the support portion 29B, and the cover glass 30 are not shown, but the imaging element package 11B has an antireflection layer 22 similarly to the imaging element package 11 in FIG. 1. As a result, similarly to the imaging element package 11 in FIG. 1, the imaging element package 11B can capture images with better image quality by a structure that reduces flare generation. The imaging element package 11B may also have a light-shielding resin layer 93 similarly to the imaging element package 11A in FIG. 17.

As shown in FIG. 26 at B, the support portion 29B has a rectangular shape having shorter sides on the left and right sides and longer sides on the bottom and top sides as viewed in a plan view, and similarly has walls along the four sides of the rectangular semiconductor substrate 21. More specifically, the support portion 29B includes one left-side wall portion 111 along the left side, one right-side wall portion 112 along the right side, two bottom-side wall portions 113 and 114 along the bottom side, and two top-side wall portions 115 and 116 along the top side.

The support portion 29B has an opening 121 between the top-side wall portion 115 and the left-side wall portion 111 as the top-side wall portion 115 is not connected to the left-side wall portion 111. Similarly, the support portion 29B includes an opening 122 between the top-side wall portion 116 and the right-side wall portion 112 as the top-side wall portion 116 is not connected to the right-side wall portion 112. Accordingly, the support portion 29B is provided with a ventilation path 101 that vents the cavity 102 to the outside by the space sandwiched between the top-side wall portion 115 and the top-side wall portion 116 as a main path 123 and having the ends of the main path 123 opened by the openings 121 and 122. The ventilation path 101 is formed so that the main path 123 extends from the opening 121 on the left end to the opening 122 on the right end along the upper edge of the support portion 29B.

As illustrated, the top-side wall portions 115 and 116 are formed so that, as viewed in a plan view, the side surfaces facing the main path 123 are straight, and the ventilation path 101 is formed so that the main path 123 has a straight shape.

In this way, the imaging element package 11B is configured as a non-airtight package structure such that the cavity 102 leads to the outside through the ventilation path 101, which can prevent increase in the internal pressure of the cavity 102 due to heat for example from reflow during mounting. As a result, in the imaging element package 11B, delamination can be prevented at the interface between the semiconductor substrate 21 and the support portion 29 or at the interface between the support portion 29 and the cover glass 30, or damage due to cohesive fracture inside the support portion 29 can be prevented, so that defective products can be prevented from being generated.

The imaging element package 11B can also be provided with the ventilation path 101 on only one of the four sides of the support portion 29B, so that dust can be prevented from entering into the cavity 102. For example, if multiple ventilation paths are provided, it is assumed that one of the ventilation paths serves as an inlet and the other paths serve as outlets, which facilitates generation of an airflow from the inlet to the outlet and thus makes it easier for dust to come into the cavity 102. In contrast, an airflow is not generated in this way in the imaging element package 11B, which makes it difficult for dust to come into the cavity 102. In addition, by providing the ventilation path 101 along the long side of the rectangle in the imaging element package 11B, the length of the path can be greater than the case in which the path is provided along the shorter side of the rectangle, and incoming dust may be reduced.

As described above, the imaging element package 11B can prevent defective products due to internal pressure in the cavity 102 from being generated, and can also reduce dust that enters into the cavity 102, so that the yield may be improved.

Figure 27:
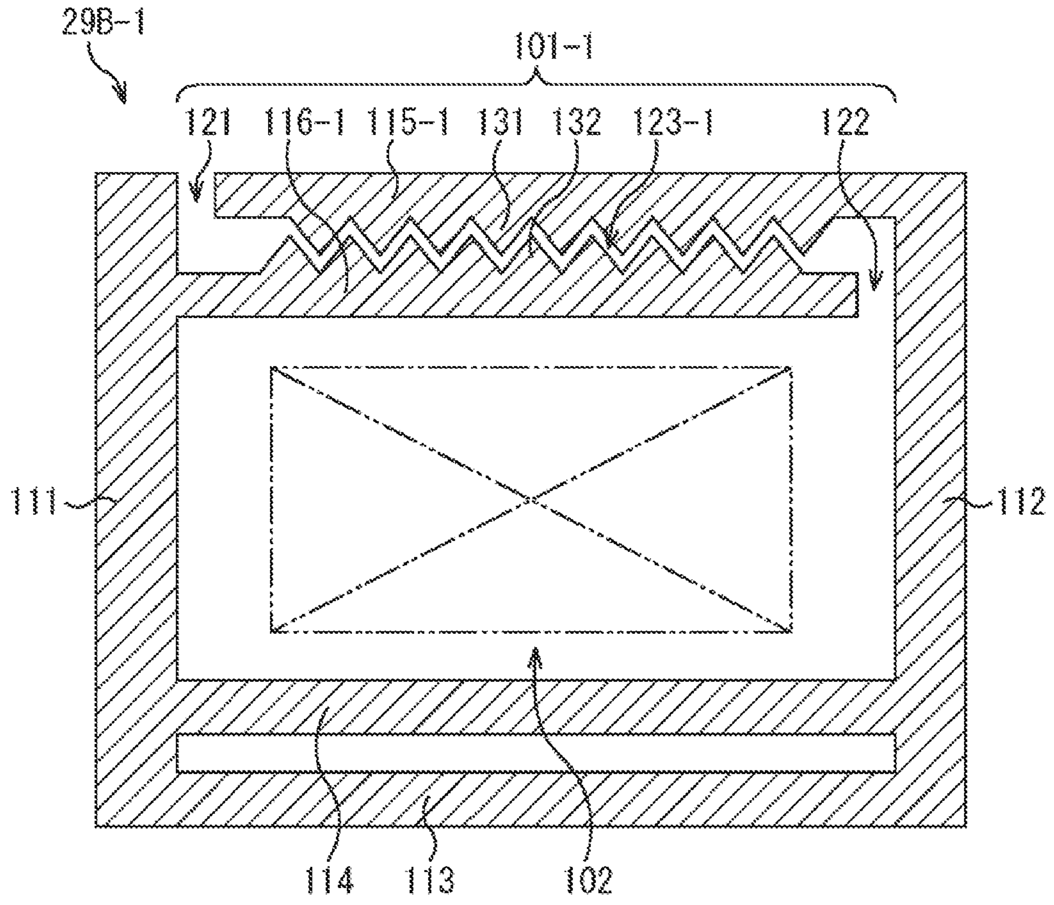
FIG. 27 is a cross-sectional view of an exemplary configuration of a support portion for illustrating a first variation of the ventilation path.

FIG. 27 is a cross-sectional view for illustrating an exemplary configuration of a support portion 29B-1 as a first variation of the ventilation path 101. In the support portion 29B-1 shown in FIG. 27, the same elements as those of the support portion 29B in FIG. 26 are designated by the same reference characters, and their detailed descriptions will not be provided.

As shown in FIG. 27, the ventilation path 101-1 is configured so that a main path 123-1 has a zigzag shape.

More specifically, the support portion 29B-1 is provided with a plurality of raised portions 131 on the side surface of the top-side wall portion 115-1 facing the main path 123-1 and a plurality of raised portions 132 facing the main path 123-1 of the top-side wall portion 116-1, when viewed in a plan view. The raised portions 131 and 132 are arranged in positions that are different from each other, and the ventilation path 101-1 is configured so that a plurality of bent portions that are bent alternately with respect to the direction of the main path 123-1 (the left-right direction in FIG. 27) are provided in a zigzag shape in the main path 123-1.

The presence of the ventilation path 101-1 having the configuration, the path length can be greater for example than the ventilation path 101 in FIG. 26, so that dust that enters from the outside into the cavity 102 can be more reduced.

Figure 28:
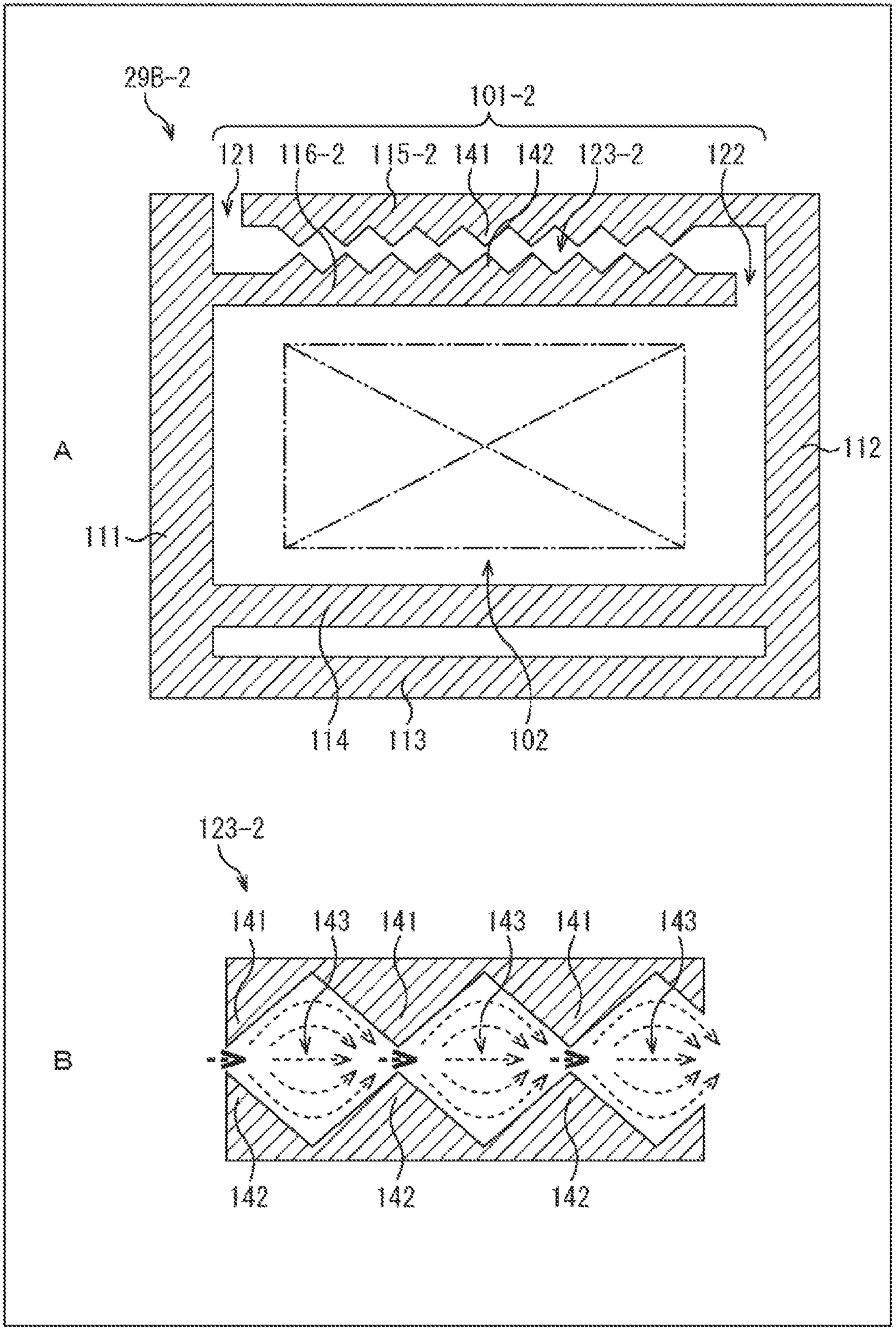
FIG. 28 is a cross-sectional view of an exemplary structure of a support portion for illustrating a second variation of the ventilation path.

FIG. 28 is a cross-sectional view of a support portion 29B-2 for illustrating a second variation of the ventilation path 101. In the support portion 29B-2 shown in FIG. 28, the same elements as those of the support portion 29B in FIG. 26 are designated by the same reference characters, and their detailed descriptions will not be provided. In FIG. 28 at B, a part of the main path 123-2 is shown enlarged.

As shown in FIG. 28, the ventilation path 101-2 is configured so that the main path 123-2 has a plurality of airflow-dispersing sections 143 in a substantially diamond shape.

More specifically, the support portion 29B-2 is provided with a plurality of raised portions 141 on the side of the top-side wall portion 115-2 facing the main path 123-2 and a plurality of raised portions 142 on the side of the top-side wall portion 116-2 facing the main path 123-2 when viewed in a plan view. As the raised portions 141 and 142 are arranged to be symmetrical with each other, the ventilation path 101-2 is provided with a plurality of airflow-dispersing sections 143 in the main path 123-2. The raised portions 141 and 142 are shaped with inclined surfaces on both sides, and the airflow-dispersing sections 143 have a substantially diamond shape with both sides inclined to be widened and then inclined to be narrowed with respect to the direction of the main path 123-2.

Therefore, in the main path 123-2, the airflow velocity between the airflow-dispersing sections 143 is constant while the airflow is dispersed inside the airflow-dispersing sections 143, as indicated by the dashed-dotted line arrows in FIG. 28 at B. As a result, in the main path 123-2, the velocity of dust that enters into the airflow-dispersing sections 143 is lowered in the ventilation path 101-2, and the entry of dust into the cavity 102 from the outside can be further reduced.

Figure 29:
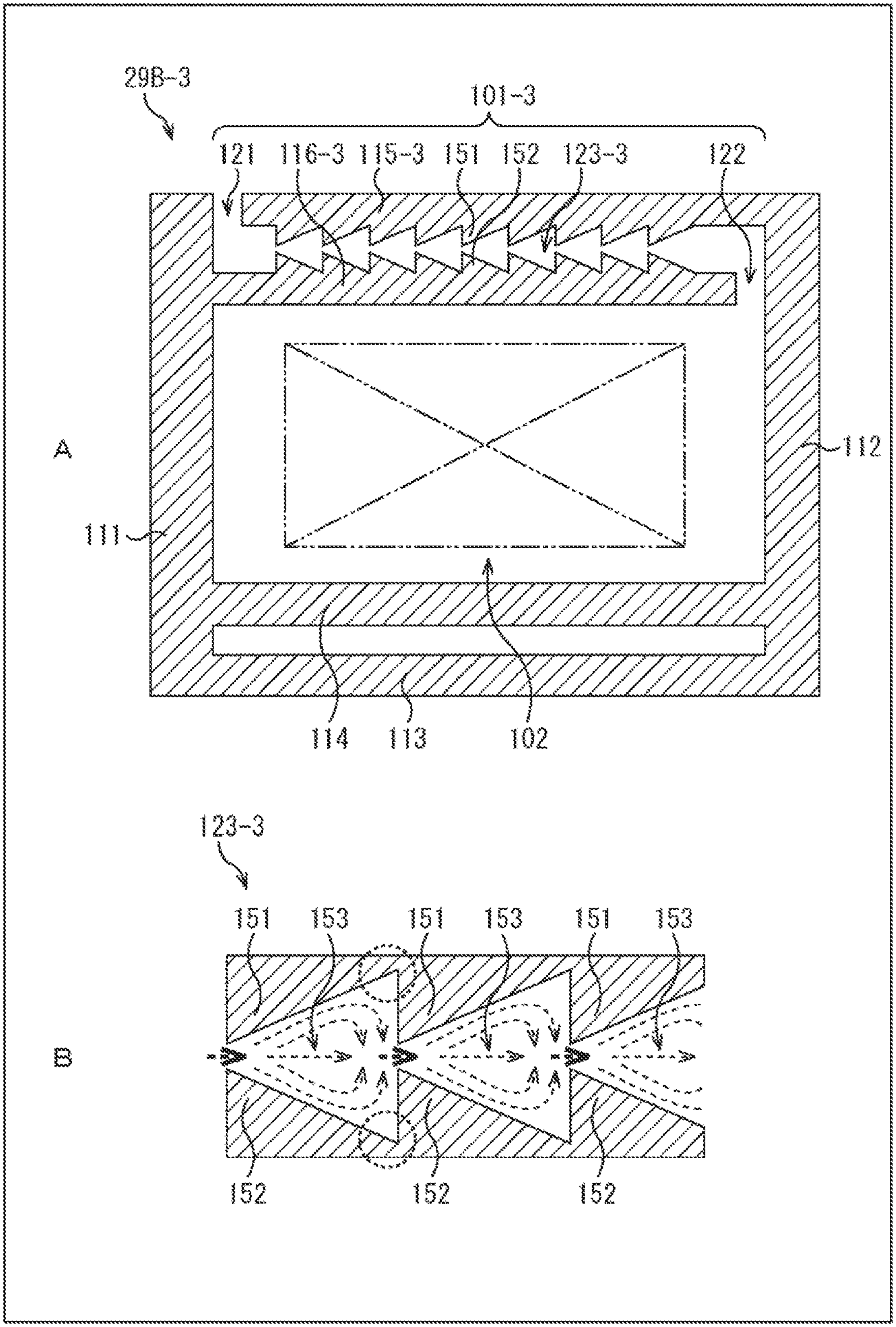
FIG. 29 is a cross-sectional view of an exemplary configuration of a support portion for illustrating a third variation of the ventilation path.

FIG. 29 is a cross-sectional view of an exemplary configuration of a support portion 29B-3 for illustrating a third variation of the ventilation path 101. In the support portion 29B-3 shown in FIG. 29, the same elements as those of the support portion 29B in FIG. 26 are designated by the same reference characters, and their detailed descriptions will not be provided. In FIG. 29 at B, a part of the main path 123-3 is shown enlarged.

As shown in FIG. 29, the ventilation path 101-3 is configured so that the main path 123-3 has a plurality of airflow-dispersing sections 153 in the form of a substantially triangular shape.

More specifically, the support portion 29B-3 is provided with a plurality of raised portions 151 on the side surface of the top-side wall portion 115-3 facing the main path 123-3 and a plurality of raised portions 152 on the side surface of the top-side wall portion 116-3 facing the main path 123-3, when viewed in a plan view. The raised portions 151 and 152 are arranged to be symmetrical with each other, so that the ventilation path 101-3 is provided with a plurality of airflow-dispersing sections 153 in the main path 123-3. The raised portions 151 and 152 are shaped to have an inclined surface on the side of the cavity 102 (the right side in FIG. 29 at B) and an orthogonal surface on the external side (the left side in FIG. 29 at B). As a result, the airflow-dispersing sections 153 has a substantially triangular shape with opposed side surfaces inclined to be widened and narrowed orthogonally with respect to the direction of the main path 123-3 toward the cavity 102 from the external side.

Therefore, in the main path 123-3, the velocity of the airflow between the airflow-dispersing sections 153 is constant while the airflow is dispersed inside the airflow-dispersing sections 153 as indicated by the dashed-dotted line arrows in FIG. 29 at B. As a result, the velocity of dust that enters into the airflow-dispersing sections 153 is lowered in the main path 123-3 in the ventilation path 101-3, and the dust that enters into the cavity 102 from the outside can be further reduced. In particular, since the airflow stagnates at the corners indicated by the dashed circles in FIG. 29 at B, the corners can function as dust traps for dust that enters into the vicinity of the corners.

Figure 30:
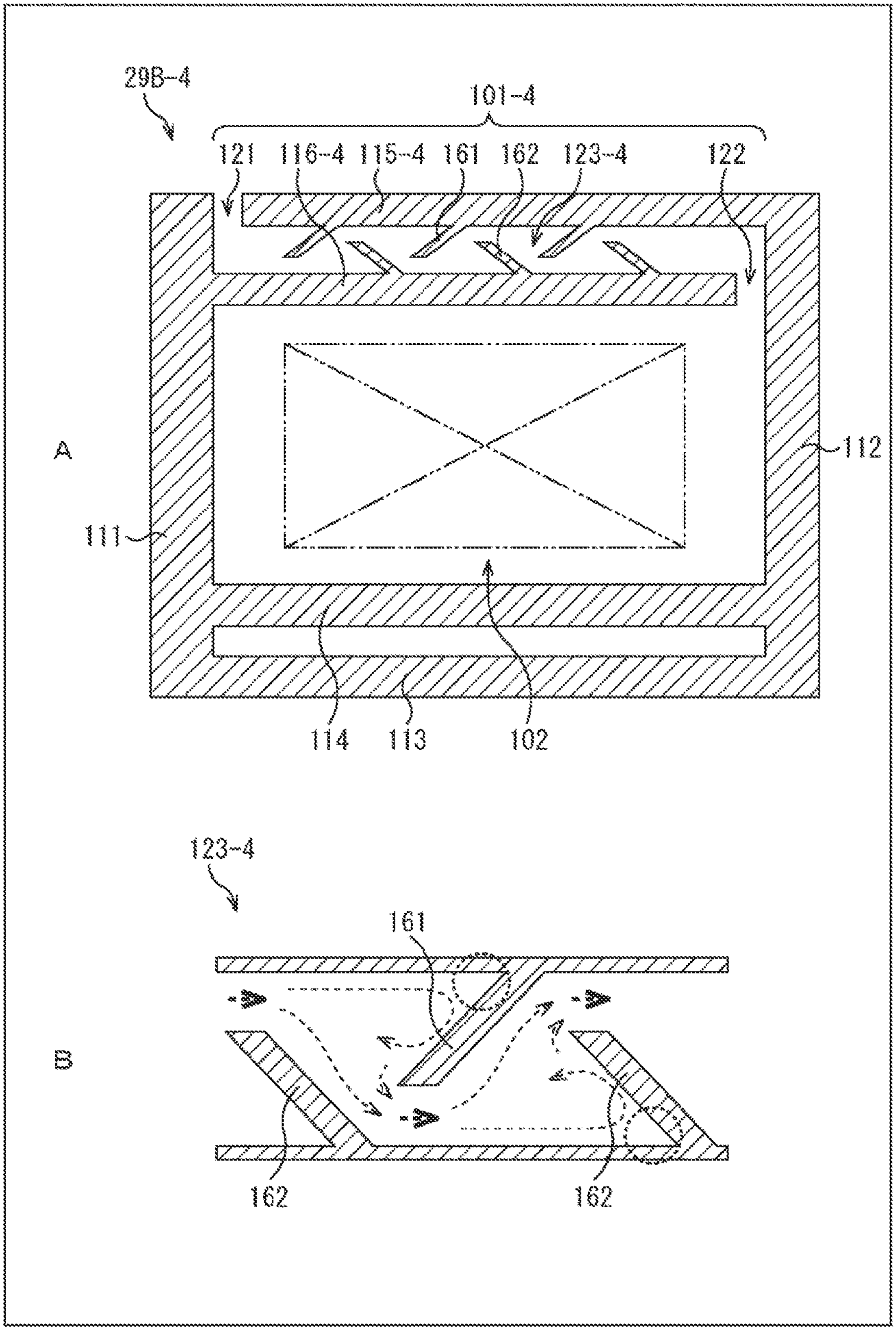
FIG. 30 is a cross-sectional view of an exemplary configuration of a support portion for illustrating a fourth variation of the ventilation path.

FIG. 30 is a cross-sectional view of an exemplary configuration of the support portion 29B-4 for illustrating a fourth variation of the ventilation path 101. In the support portion 29B-4 shown in FIG. 30, the same elements as those of the support portion 29B in FIG. 26 are designated by the same reference characters, and their detailed descriptions will not be provided. In FIG. 30 at B, a part of the main path 123-4 is shown enlarged.

As shown in FIG. 30, the ventilation path 101-4 has such a shape that the main path 123-4 has a plurality of valve portions 161 and 162.

More specifically, when viewed in a plan view, the support portion 29B-4 is provided with the plurality of valve portions 161 that extend from the side surface of the top-side wall portion 115-4 facing the main path 123-4 and the plurality of valve portions 162 that extend from the side surface of the top-side wall portion 116-4 facing the main path 123-4. The valve portions 161 and 162 are arranged alternately and asymmetrically in positions that are different from each other. The valve portion 161 is provided inclined (from the upper right to the lower left) with respect to the direction of the main path 123-4 so as to extend from the side of the cavity 102 (the right side in FIG. 30 at B) to the external side (the left side in FIG. 30 at B) in the direction from the base to the tip. Similarly, the valve portion 162 is provided inclined (from the lower right to the upper left) with respect to the direction of the main path 123-4 so as to extend from the side of cavity 102 (the right side in FIG. 30 at B) to the external side (the left side in FIG. 30 at B) in the direction from the base to the tip.

Therefore, in the main path 123-4, as indicated by the dashed-dotted line arrows in FIG. 30 at B, the airflows advance in the direction between the top-side wall portion 115-4 and the base of the valve portion 161 and in the direction between the top-side wall portion 116-4 and the base of the valve portion 162 stagnate at the corners indicated by the dashed line circles and therefore the corners can function as dust traps. In addition, the valve portions 161 and 162 are provided inclined in the ventilation path 101-4 in the main path 123-4, so that airflows pushed back toward the external side (the left side in FIG. 30 at B) are generated, which lowers the speed of the airflows that enter into the side of the cavity 102 (the right side in FIG. 30 at B), and dust that enters into the cavity 102 can be reduced as a result.

Figure 31:
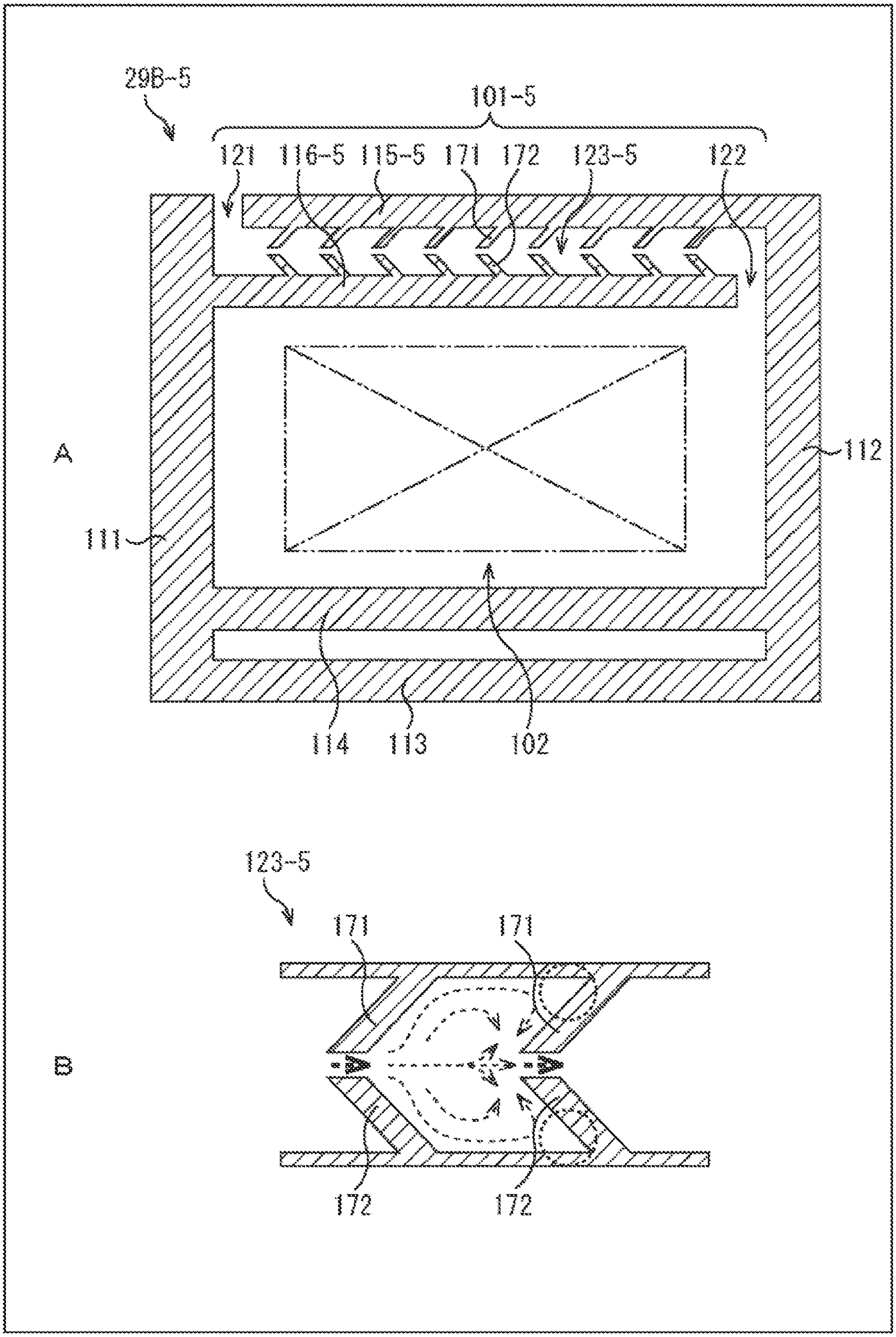
FIG. 31 is a cross-sectional view of an exemplary configuration of a support portion for illustrating a fifth variation of the ventilation path.

FIG. 31 is a cross-sectional view of an exemplary configuration of a support portion 29B-5 for illustrating a fifth variation of the ventilation path 101. In the support portion 29B-5 shown in FIG. 31, the same elements as those of the support portion 29B in FIG. 26 are designated by the same reference characters, and their detailed descriptions will not be provided. In FIG. 31 B, a part of the main path 123-5 is shown enlarged.

As shown in FIG. 31, the ventilation path 101-5 has such a shape that the main path 123-5 has a plurality of valve portions 171 and 172.

More specifically, when viewed in a plan view, the support portion 29B-5 is provided with the plurality of valve portions 171 that extend from the side surface of the top-side wall portion 115-5 facing the main path 123-5 and the plurality of valve portions 172 that extend from the side surface of the top-side wall portion 116-4 facing the main path 123-5. The valve portions 171 and 172 are arranged in positions symmetrical to each other. The valve portion 171 is provided inclined (from the upper right to the lower left) with respect to the direction of the main path 123-5 so as to extend from the side of the cavity 102 (the right side in FIG. 31 at B) to the external side (the left side in FIG. 31 at B) in the direction from the base to the tip. Similarly, the valve portion 172 is provided inclined (inclined from the lower right to the upper left) with respect to the direction of the main path 123-5 so as to extend from the side of the cavity 102 (the right side in FIG. 31 at B) to the external side (the left side in FIG. 31 at B) in the direction from the base to the tip.

Therefore, in the main path 123-5, the airflow having passed through the gap between the valve portions 171 and 172 is dispersed as indicated by the dashed-dotted line arrows in FIG. 31 at B. The airflows that advance in the direction between the top-side wall portion 115-5 and the base of the valve portion 171 and in the direction between the top-side wall portion 116-5 and the base of the valve portion 172 stagnate at the corners indicated by the dashed circles, so that when dust enters near the corners, the corners function as dust traps. In addition, since the ventilation path 101-5 has the valve portions 171 and 172 provided inclined in in the main path 123-5, airflows to be pushed back toward the external side (the left side in FIG. 31 at B) are generated, and the generated airflows are mixed with the airflow to travel straight toward the valve portions 171 and 172, entry of dust into the cavity 102 can be reduced.

Figure 32:
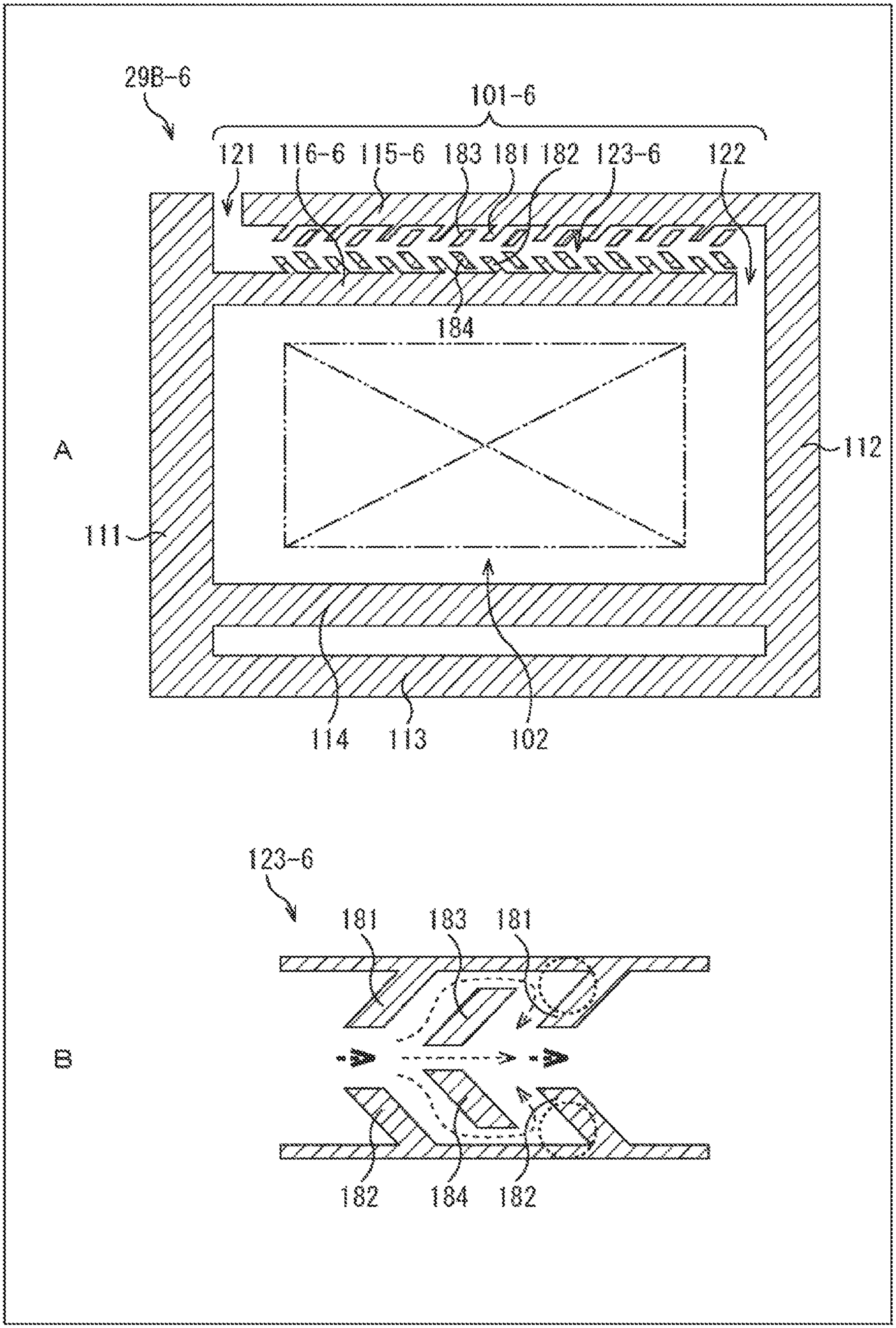
FIG. 32 is a cross-sectional view of an exemplary configuration of a support portion for illustrating a sixth variation of the ventilation path.

FIG. 32 is a cross-sectional view of an exemplary configuration of the support portion 29B-6 for illustrating a sixth variation of the ventilation path 101. In the support portion 29B-6 shown in FIG. 32, the same elements as those of the support portion 29B in FIG. 26 are designated by the same reference characters, and their detailed descriptions will not be provided. In FIG. 32 at B, a part of a main path 123-6 is shown enlarged.

As shown in FIG. 32, the ventilation path 101-6 has such a shape that a plurality of valve portions 181 and 182 and a plurality of independent valve portions 183 and 184 are provided in the main path 123-6.

More specifically, when viewed in a plan view, the support portion 29B-6 is provided with the plurality of valve portions 181 that extend from the side surface of the top-side wall portion 115-6 facing the main path 123-6 and the plurality of valve portions 182 that extend from the side surface of the top side wall portion 116-6 facing the main path 123-6. The plurality of independent valve portions 183 and 184 are formed independently of the top-side wall portions 115-6 and 116-6, the independent valve portions 183 are provided alternately with the valve portions 181 and the independent valve portions 184 are provided alternately with the valve portions 182 along the main path 123-6.

The valve portions 181 and 182 and the independent valve portions 183 and 184 are arranged in positions symmetrical to each other. The valve portion 181 is provided inclined (from the upper right to the lower left) with respect to the direction of the main path 123-5 so as to extend from the side of the cavity 102 (the right side in FIG. 32 at B) to the external side (the left side in FIG. 32 at B) in the direction from the base to the tip. Similarly, the valve portion 182 is provided inclined (from the lower right to the upper left) with respect to the direction of the main path 123-5 so as to extend from the side of the cavity 102 (the right side in FIG. 32 at B) to the external side (the left side in FIG. 32 at B) in the direction from the base to the tip. The independent valve portion 183 is provided inclined in the same manner as the valve portion 181, and the independent valve portion 184 is provided inclined in the same manner as the valve portion 182.

Therefore, in the main path 123-6, the airflow that passes through the gap between the valve portions 181 and 182 is forced to be dispersed in three directions by the independent valve portions 183 and 184 as indicated by the dashed-dotted line arrow in FIG. 32 at B. The airflows that advance in the direction between the top-side wall portion 115-6 and the base of the valve portion 181 and in the direction between the top-side wall portion 116-6 and the base of the valve portion 182 stagnate at the corners indicated by the dashed line circles, so that when dust enters in the vicinity of the corners, the corners function as dust traps. In addition, since the ventilation path 101-6 has the valve portions 181 and 182 and the independent valve portions 183 and 184 provided inclined, airflows to be pushed back toward the external side (the left side in FIG. 32 at B) are generated in the main path 123-6, and the generated airflows are mixed with the airflow that advances straightforward through the independent valve portions 183 and 184, so that entry of dust into the cavity 102 can be reduced.

Figure 33:
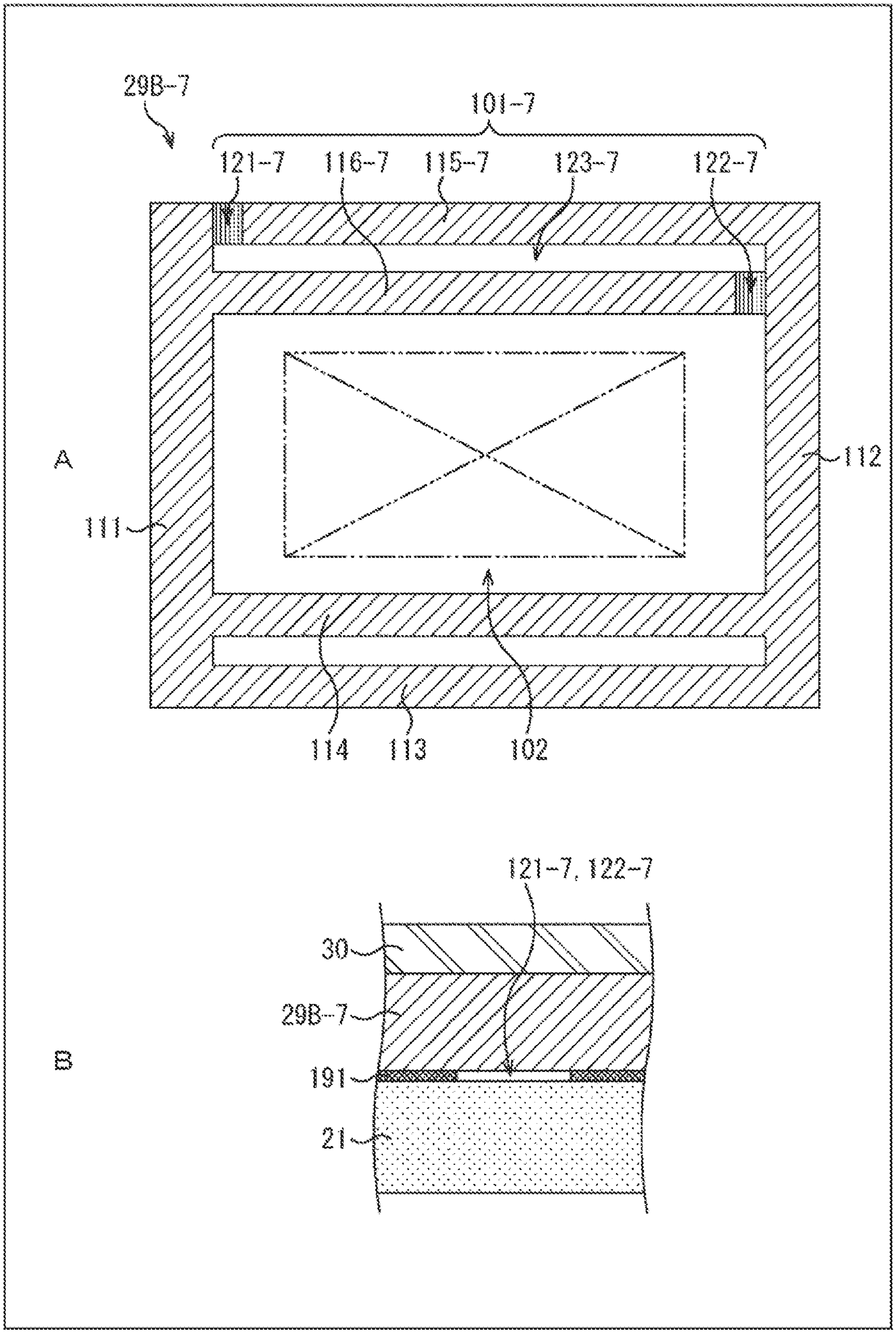
FIG. 33 is a cross-sectional view of an exemplary configuration of a support portion for illustrating a seventh variation of the ventilation path.

FIG. 33 is a cross-sectional view of an exemplary configuration of a support portion 29B-7 for illustrating a seventh variation of the ventilation path 101. In the support portion 29B-7 shown in FIG. 33, the same elements as those of the support portion 29B in FIG. 26 are designated by the same reference characters, and their detailed descriptions will not be provided. The cross-sectional structure of openings 121-7 and 122-7 is shown enlarged in FIG. 33 at B.

As shown in FIG. 33, similarly to the ventilation path 101 in FIG. 26, the ventilation path 101-7 is configured so that the main path 123-7 has a straight shape, and the openings 121-7 and 122-7 are formed by not applying an adhesive 191 thereto. In other words, the semiconductor substrate 21 and the support portion 29B-7 are bonded by the adhesive 191, and the adhesive 191 is not applied to the areas corresponding to the openings 121-7 and 122-7.

More specifically, the support portion 29B-7 has such a shape that a top-side wall portion 115-7 is connected to a left-side wall portion 111, but as shown in FIG. 33 at B, the adhesive 191 is not applied in the area to be the opening 121-7, so that a gap corresponding to the thickness of the adhesive 191 (1 μm to 2 μm) is created, and the gap becomes the opening 121-7. Similarly, the support portion 29B-7 has such a shape that a top-side wall portion 116-7 is connected to a right-side wall portion 112, but as shown in FIG. 33 at B, the adhesive 191 is not applied in the area to be the opening 122-7, so that a gap corresponding to the thickness of the adhesive 191 (1 μm to 2 μm) is created, and the gap becomes the opening 122-7.

Therefore, the ventilation path 101-7 having the configuration can prevent increase in the internal pressure of the cavity 102 and can also prevent dust from entering the cavity 102 from the outside. The openings 121 and 122 of the ventilation paths 101-1 to 101-6 shown in FIGS. 27 to 32 may also be configured by providing an area where adhesive 191 is not applied.

Figure 34:
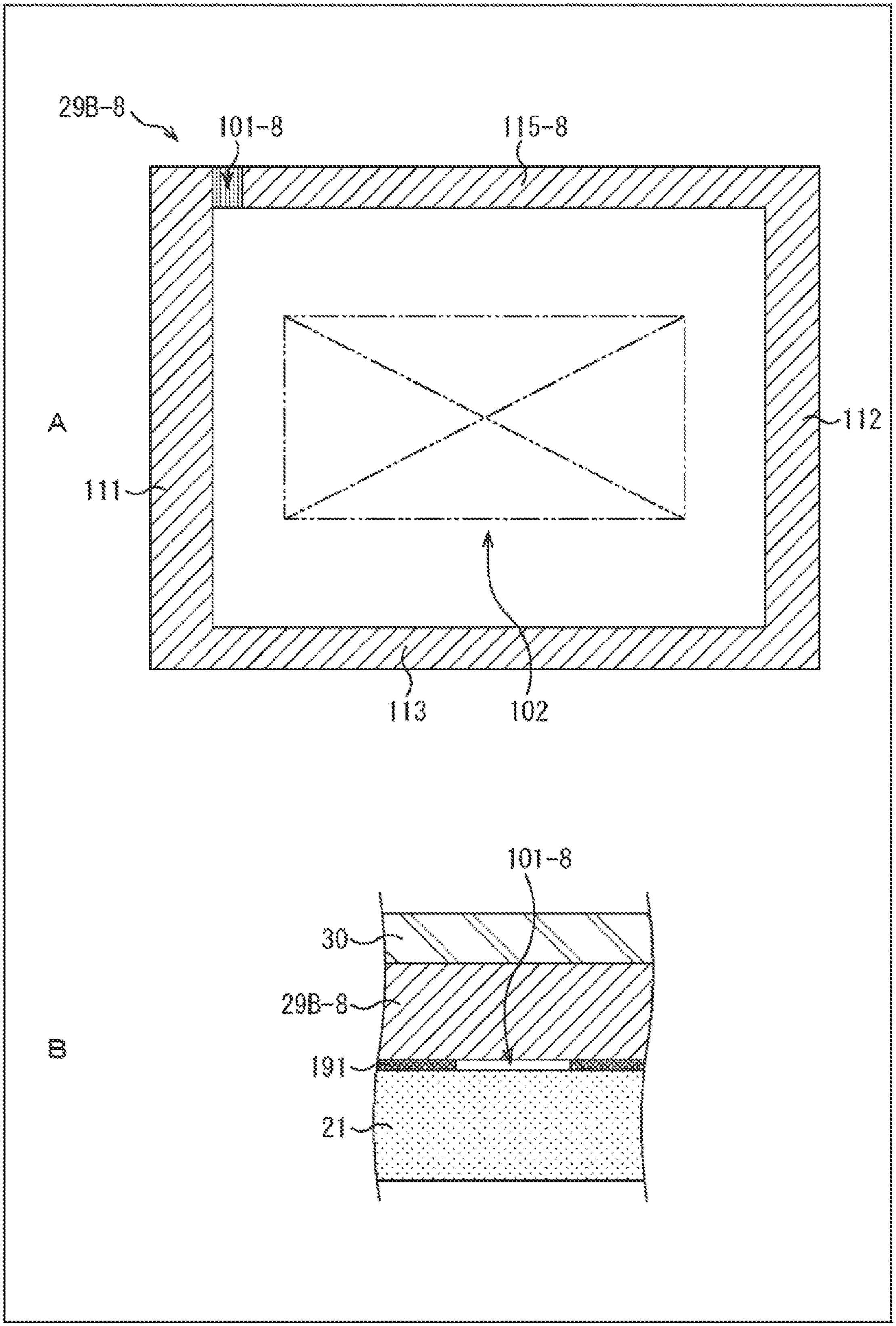
FIG. 34 is a cross-sectional view of an exemplary configuration of a support portion for illustrating an eighth variation of the ventilation path.

FIG. 34 is a cross-sectional view of an exemplary configuration of a support portion 29B-8 for illustrating an eighth variation of the ventilation path 101. In the support portion 29B-8 shown in FIG. 34, the same elements as those of the support portion 29B in FIG. 26 are designated by the same reference characters, and their detailed descriptions will not be provided. The cross-sectional structure of ventilation path 101-8 is shown enlarged in FIG. 34 at B.

As shown in FIG. 34, the support portion 29B-8 is formed so that the left-side wall portion 111, right-side wall portion 112, bottom-side wall portion 113, and top-side wall portion 115-8 are connected to surround the outer periphery. In other words, the support portion 29B-8 is formed without the two wall portions and is not provided with the main path as described above. As shown in FIG. 34 at B, by not applying the adhesive 191 in the area to be the ventilation path 101-8, a gap is provided according to the thickness of the adhesive 191 (1 μm to 2 μm), and this gap becomes the ventilation path 101-8.

Therefore, the ventilation path 101-8 having the configuration can prevent increase in the internal pressure of the cavity 102 and entry of dust into the cavity 102 from the outside can be reduced.

Exemplary Configuration of Electronic Device

The imaging element package 11 described above can be applied to various electronic devices such as an imaging system such as a digital still camera and a digital video camera, a cellular phone having an imaging function, or any other device having an imaging function.

Figure 35:
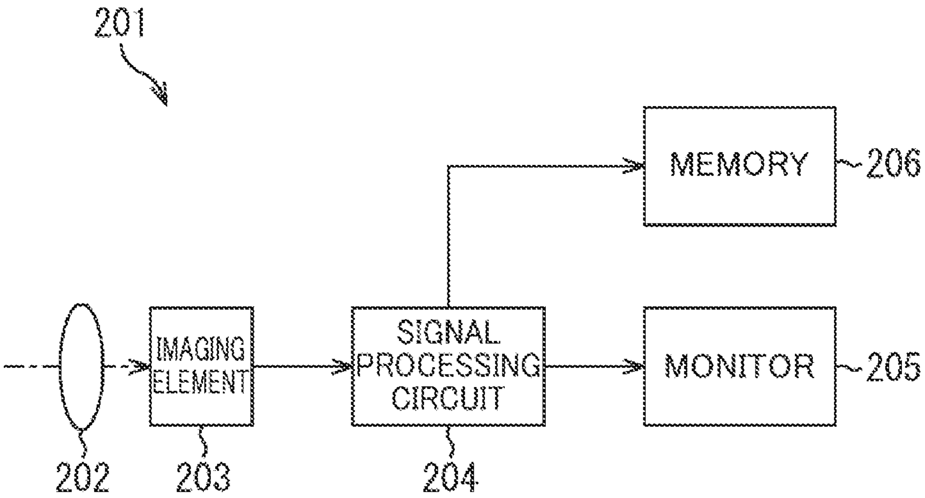
FIG. 35 is a block diagram of an exemplary configuration of an imaging device.

FIG. 35 is a block diagram of an exemplary configuration of an imaging device mounted in an electronic device.

As shown in FIG. 35, the imaging device 201 includes an optical system 202, an imaging element 203, a signal processing circuit 204, a monitor 205, and a memory 206 and is capable of capturing still and moving images.

The optical system 202 includes one or more lenses, guides light (incident light) from an object to the imaging element 203, and forms an image on the light-receiving surface of the imaging element 203.

As the imaging element 203, the imaging element package 11 with any of the above-mentioned exemplary configurations and according to any of variations is used. In the imaging element 203, electrons are accumulated for a certain period of time according to the image formed on the light-receiving surface via the optical system 202. The signal corresponding to the electrons accumulated in the imaging element 203 is then supplied to a signal processing circuit 204.

The signal processing circuit 204 carries out various types of signal processing to pixel signals output from the imaging element 203. The image (image data) obtained by the signal processing carried out by the signal processing circuit 204 is supplied to the monitor 205 for display or to the memory 206 for storage (recording).

The imaging device 201 having the configuration can capture images with better quality for example by using the imaging element package 11 described above.

Usage Example of Image Sensor

Figure 36:
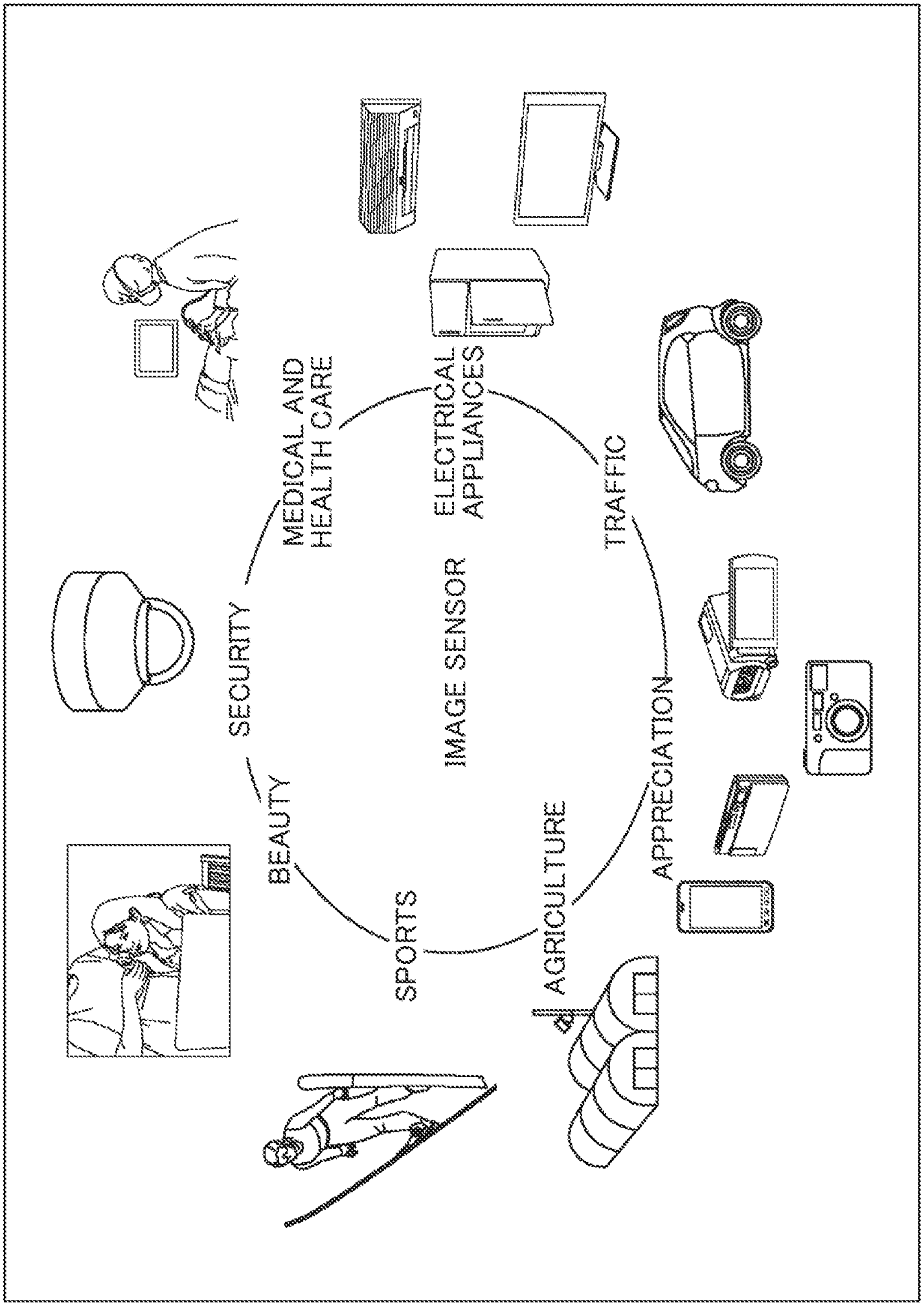
FIG. 36 illustrates examples of how a solid-state imaging device is used.

FIG. 36 illustrates examples of how the above-described image sensor (imaging element) is used.

The above-described image sensor can be used in various cases for sensing light such as visible light, infrared light, ultraviolet light, and X-ray as will be described.

- Devices that capture images used for viewing, such as digital cameras and mobile apparatuses with camera functions
- Devices used for transportation, such as in-vehicle sensors that capture front, rear, surrounding, and interior view images of automobiles, monitoring cameras that monitor traveling vehicles and roads, ranging sensors that measure a distance between vehicles, and the like, for safe driving such as automatic stop, recognition of a driver's condition, and the like
- Devices used for home appliances such as TVs, refrigerators, and air conditioners in order to capture an image of a user's gesture and perform device operations in accordance with the gesture
- Devices used for medical treatment and healthcare, such as endoscopes and devices that perform angiography by receiving infrared light
- Devices used for security, such as monitoring cameras for crime prevention and cameras for personal authentication
- Devices used for beauty, such as a skin measuring device that captures images of the skin and a microscope that captures images of the scalp
- Devices used for sports, such as action cameras and wearable cameras for sports applications
- Devices used for agriculture, such as cameras for monitoring conditions of fields and crops

Exemplary Combinations of Configurations

The present disclosure can also be configured as follows.

(1)

An imaging element package including a semiconductor substrate provided with a photodiode, a support portion provided along an outer periphery of the semiconductor substrate to support a cover glass that protects a light-receiving surface of the semiconductor substrate, and an antireflection layer provided between the support portion and the semiconductor substrate at least in an area where the support portion is provided.

(2)

The imaging element package according to (1), wherein the antireflection layer is provided entirely on the light-receiving surface of the semiconductor substrate, and the support portion is stacked on the antireflection layer.

(3)

The imaging element package according to (2) further including a light-shielding layer provided stacked on the antireflection layer with a prescribed width outwardly from a boundary between an effective pixel area where pixels effectively used for capturing images are located and a peripheral area provided in a peripheral part outside of the effective pixel area, wherein the light-shielding layer has an outer shape having four corners rounded in an arc shape with a prescribed radius of curvature when viewed in a plan view.

(4)

The imaging element package according to (2) or (3), wherein a part of the support portion and a part of an organic layer provided to cover the antireflection layer overlap each other when viewed in a plan view.

(5)

The imaging element package according to (2) or (3), wherein a peripheral circuit including a capacitor is provided in the peripheral area provided in the peripheral part that is outside of the effective pixel area where pixels effectively used for capturing images are provided, the imaging element package further including a light-shielding layer provided between the peripheral circuit and the support portion so as to overlap the peripheral circuit when viewed in a plan view.

(6)

The imaging element package according to (5), wherein a sensor substrate having the semiconductor substrate and a logic substrate provided with a logic circuit are layered on each other to constitute a layered structure, the peripheral circuit is provided on the side of the logic circuit, and a light-shielding layer arranged between the peripheral circuit and the support portion is provided at at least one of a wiring layer for the sensor substrate and a wiring layer for the logic substrate so that the light-shielding layer overlaps the peripheral circuit when viewed in a plan view.

(7)

The imaging element package according to (3), wherein the light-shielding layer is provided to extend as far as below the support portion, and an antireflection layer is provided between a part of the light-shielding layer not covered with the organic layer and the support portion.

(8)

The imaging element package according to any one of (3) to (7), wherein a light-shielding resin layer is provided between the antireflection layer and the support portion, and the support portion has a ventilation hole.

(9)

The imaging element package according to any one of (3) to (7) wherein a light-shielding resin layer separated by a first oxide layer in a lattice shape is provided between the antireflection layer and the support portion, a second oxide layer is provided to cover the first oxide layer and the light-shielding resin layer, and the support portion is stacked on the second oxide layer.

(10)

The imaging element package according to (9), wherein the light-shielding resin layer has an upper surface formed in an uneven shape, the imaging element package further comprising an uneven structure provided under the support portion to engage with the uneven shape.

(11)

The imaging element package according to (1), wherein a light-shielding resin layer is provided on an uppermost surface of the peripheral area provided in the peripheral part that is outside of the effective pixel area where pixels effectively used for capturing images are provided.

(12)

The imaging element package according to (11), wherein the light-shielding resin layer is provided from a vicinity of the boundary between the effective pixel area and the peripheral area to an area that overlaps the support portion.

(13)

The imaging element package according to (11), wherein the light-shielding resin layer is provided from a vicinity of the boundary between the effective pixel area and the peripheral area to an area before the support portion.

(14)

The imaging element package according to any one of (11) to (13), wherein the light-shielding resin layer is patterned by providing slits.

(15)

The imaging element package according to (14), wherein a light-shielding layer provided under the light-shielding resin layer is patterned by providing slits according to the pattern of the light-shielding resin layer.

(16)

The imaging element package according to any one of (11) to (15) further including an antireflection layer provided entirely on the light-receiving surface of the semiconductor substrate, a light-shielding layer stacked on the antireflection layer in the peripheral area, a resin layer stacked on the light-shielding layer to absorb light, and a lens material stacked on the light-shielding layer and the resin layer.

(17)

The imaging element package according to (16), wherein the light-shielding layer is provided in a range substantially the same as an edge of the lens material, and the light-shielding resin layer is stacked on the lens material and the antireflection layer.

(18)

The imaging element package according to (16), wherein the light-shielding layer is provided as far as to an edge of the semiconductor substrate, and the light-shielding resin layer is separated into a part to be stacked on the lens material and a part to be stacked on the light-shielding layer by providing a slit in a vicinity of an edge of the lens material.

(19)

The imaging element package according to (18), wherein the light-shielding layer is provided with a slit in a location corresponding to the slit provided in the light-shielding resin layer.

(20)

The imaging element package according to (1), wherein a ventilation path configured to ventilate an internal space surrounded by the semiconductor substrate, the support portion, and the cover glass to outside.

(21)

The imaging element package according to (20), wherein when viewed in a plan view, the semiconductor substrate has a rectangular shape, and the ventilation path extends from one end side to the other end side of one long-side wall portion of the support portion in a shape having wall portions provided along the four sides of the rectangular shape.

(22)

The imaging element package according to (21), wherein in the ventilation path, the main path is formed in a straight shape.

(23)

The imaging element package according to (21), wherein the ventilation path is configured such that the main path is provided with a plurality of bent portions that are bent alternately with respect to a direction along the main path.

(24)

The imaging element package according to (21), wherein the ventilation path is configured such that the main path has a plurality of airflow-dispersing sections having opposed side surfaces inclined to be widened and narrowed with respect to a direction along the main path.

(25)

The imaging element package according to (21), wherein the ventilation path is configured such that the main path is provided with a plurality of airflow-dispersing sections having opposed side surfaces inclined to be widened and narrowed substantially orthogonally with respect to a direction along the main path.

(26)

The imaging element package according to (21), wherein the ventilation path is configured such that a plurality of valve portions that extend from a side surface of the main path are provided alternately and asymmetrically on opposed side surfaces of the main path, and the valve portions are provided inclined with respect to a direction along the main path from the internal space side to the external side in the direction from the base to the tip.

(27)

The imaging element package according to (21), wherein the ventilation path is configured such that the main path is provided with a plurality of valve portions that extend from a side surface of the main path symmetrically on opposed side surfaces of the main path, and the valve portions are provided inclined with respect to a direction along the main path from the internal space side to the external side in the direction from the base to the tip.

(28)

The imaging element package according to (27), wherein a plurality of independent valve portions provided independently of the side surfaces of the main path and having the same inclination as the valve portions are provided alternately with the valve portions along the main path.

(29)

The imaging element package according to any one of (20) to (28), wherein the ventilation path is provided by providing an area where an adhesive for bonding the semiconductor substrate and the support portion is not applied.

(30)

An electronic device including an imaging element package that includes a semiconductor substrate provided with a photodiode, a support portion provided along an outer periphery of the semiconductor substrate to support a cover glass that protects a light-receiving surface of the semiconductor substrate, and an antireflection layer provided between the support portion and the semiconductor substrate at least in an area where the support portion is provided.

Note that embodiments of the present disclosure are not limited to the above-mentioned embodiments and can be modified in various manners without departing from the scope and spirit of the present disclosure. The advantageous effects described in the present specification are merely exemplary and are not limitative, and other advantageous effects may be achieved.

REFERENCE SIGNS LIST

11 Imaging element package
12 Effective pixel area
13 Peripheral area
21 Semiconductor substrate
22 Antireflection layer
23 Light-shielding layer
24 Inter-pixel light-shielding layer
25 Planarization layer
26 Color filter layer
27 Organic layer
28 On-chip lens Layer
29 Support portion
30 Cover glass
91, 92 Flare prevention layer
93 Light-shielding resin layer

What is claimed is:

1. An imaging element package, comprising:

a semiconductor substrate provided with a photodiode;

a support portion provided along an outer periphery of the semiconductor substrate to support a cover glass that protects a light-receiving surface of the semiconductor substrate;

an antireflection layer provided between the support portion and the semiconductor substrate at least in an area where the support portion is provided; and a light-shielding layer provided stacked on the antireflection layer with a prescribed width outwardly from a boundary between an effective pixel area where pixels effectively used for capturing images are located and a peripheral area provided in a peripheral part outside of the effective pixel area, wherein the light-shielding layer has an outer shape having four corners rounded in an arc shape with a prescribed radius of curvature when viewed in a plan view, wherein the antireflection layer is provided entirely on the light-receiving surface of the semiconductor substrate, and wherein the support portion is stacked on the antireflection layer.

2. The imaging element package according to claim 1, wherein a part of the support portion and a part of an organic layer provided to cover the antireflection layer overlap each other when viewed in a plan view.

3. The imaging element package according to claim 1, wherein a peripheral circuit including a capacitor is provided in a peripheral area provided in a peripheral part that is outside of an effective pixel area where pixels effectively used for capturing images are provided, the imaging element package further comprising a light-shielding layer provided between the peripheral circuit and the support portion so as to overlap the peripheral circuit when viewed in a plan view.

4. The imaging element package according to claim 3, wherein a sensor substrate having the semiconductor substrate and a logic substrate provided with a logic circuit are layered on each other to constitute a layered structure, the peripheral circuit is provided on a side of the logic circuit, and a light-shielding layer arranged between the peripheral circuit and the support portion is provided at at least one of a wiring layer for the sensor substrate and a wiring layer for the logic substrate so that the light-shielding layer overlaps the peripheral circuit when viewed in a plan view.

5. The imaging element package according to claim 1, wherein the light-shielding layer is provided to extend as far as below the support portion, and an antireflection layer is provided between a part of the light-shielding layer not covered with an organic layer and the support portion.

6. The imaging element package according to claim 1, wherein a light-shielding resin layer is provided between the antireflection layer and the support portion, and the support portion has a ventilation hole.

7. The imaging element package according to claim 1, wherein a light-shielding resin layer separated by a first oxide layer in a lattice shape is provided between the antireflection layer and the support portion, a second oxide layer is provided to cover the first oxide layer and the light-shielding resin layer, and the support portion is stacked on the second oxide layer.

8. The imaging element package according to claim 7, wherein the light-shielding resin layer has an upper surface formed in an uneven shape, the imaging element package further comprising an uneven structure provided under the support portion to engage with the uneven shape.

9. An imaging element package, comprising:

a semiconductor substrate provided with a photodiode;

an on-chip lens layer disposed on a light incident surface side of the semiconductor substrate;

a support portion provided along an outer periphery of the semiconductor substrate to support a cover glass that protects a light-receiving surface of the semiconductor substrate; and an antireflection layer provided between the support portion and the semiconductor substrate at least in an area where the support portion is provided, wherein a light-shielding resin layer is provided on an uppermost surface of a peripheral area provided in a peripheral part that is outside of an effective pixel area where pixels effectively used for capturing images are provided, wherein a first portion of the light-shielding resin layer is in contact with a light incident surface side of a portion of the on-chip lens layer, and wherein a second portion of the light-shielding resin layer is in contact with the antireflection layer.

10. The imaging element package according to claim 9, wherein the light-shielding resin layer is provided from a vicinity of a boundary between the effective pixel area and the peripheral area to an area that overlaps the support portion.

11. The imaging element package according to claim 9, wherein the light-shielding resin layer is provided from a vicinity of a boundary between the effective pixel area and the peripheral area to an area before the support portion.

12. The imaging element package according to claim 9, wherein the light-shielding resin layer is patterned by providing slits.

13. The imaging element package according to claim 12, wherein a light-shielding layer provided under the light-shielding resin layer is patterned by providing slits according to the pattern of the light-shielding resin layer.

14. The imaging element package according to claim 9, further comprising:

an antireflection layer provided entirely on the light-receiving surface of the semiconductor substrate;

a light-shielding layer stacked on the antireflection layer in the peripheral area;

a resin layer stacked on the light-shielding layer to absorb light; and a lens material stacked on the light-shielding layer and the resin layer.

15. The imaging element package according to claim 14, wherein the light-shielding layer is provided in a range substantially the same as an edge of the lens material, and the light-shielding resin layer is stacked on the lens material and the antireflection layer.

16. The imaging element package according to claim 14, wherein the light-shielding layer is provided as far as to an edge of the semiconductor substrate, and the light-shielding resin layer is separated into a part to be stacked on the lens material and a part to be stacked on the light-shielding layer by providing a slit in a vicinity of an edge of the lens material.

17. The imaging element package according to claim 16, wherein the light-shielding layer is provided with a slit in a location corresponding to the slit provided in the light-shielding resin layer.

18. An electronic device comprising an imaging element package, the imaging element package comprising:

a semiconductor substrate provided with a photodiode;

a support portion provided along an outer periphery of the semiconductor substrate to support a cover glass that protects a light-receiving surface of the semiconductor substrate;

an antireflection layer provided between the support portion and the semiconductor substrate at least in an area where the support portion is provided; and a light-shielding layer provided stacked on the antireflection layer with a prescribed width outwardly from a boundary between an effective pixel area where pixels effectively used for capturing images are located and a peripheral area provided in a peripheral part outside of the effective pixel area, wherein the light-shielding layer has an outer shape having four corners rounded in an arc shape with a prescribed radius of curvature when viewed in a plan view, wherein the antireflection layer is provided entirely on the light-receiving surface of the semiconductor substrate, and wherein the support portion is stacked on the antireflection layer.

* * * * *